(12) United States Patent
Akimoto et al.

(10) Patent No.: US 9,136,439 B2
(45) Date of Patent: Sep. 15, 2015

(54) SEMICONDUCTOR LIGHT EMITTING DEVICE

(71) Applicant: KABUSHIKI KAISHA TOSHIBA, Minato-ku, Tokyo (JP)

(72) Inventors: Yosuke Akimoto, Kanagawa-Ken (JP); Yoshiaki Sugizaki, Kanagawa-Ken (JP); Hideyuki Tomizawa, Kanagawa-Ken (JP); Masanobu Ando, Fukuoka-ken (JP); Akihiro Kojima, Kanagawa-Ken (JP); Gen Watari, Fukuoka-ken (JP); Naoya Ushiyama, Fukuoka-ken (JP); Tetsuro Komatsu, Fukuoka-ken (JP); Miyoko Shimada, Kanagawa-Ken (JP); Hideto Furuyama, Kanagawa-Ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/781,683

(22) Filed: Feb. 28, 2013

(65) Prior Publication Data

US 2013/0313590 A1    Nov. 28, 2013

(30) Foreign Application Priority Data

May 25, 2012    (JP) .................................. 2012-120178

(51) Int. Cl.
*H01L 33/44*    (2010.01)
*H01L 27/15*    (2006.01)
(Continued)

(52) U.S. Cl.
CPC ................ *H01L 33/44* (2013.01); *H01L 27/15* (2013.01); *H01L 33/486* (2013.01); *H01L 33/62* (2013.01); *H01L 2224/16* (2013.01)

(58) Field of Classification Search
CPC combination set(s) only.
See application file for complete search history.

(56) References Cited

U.S. PATENT DOCUMENTS

| 7,449,727 | B2 | 11/2008 | Sato et al. |
| 7,768,754 | B2 | 8/2010 | Collins, III et al. |

(Continued)

FOREIGN PATENT DOCUMENTS

| EP | 2 390 936 A1 | 11/2011 |
| JP | 2001-015815 A | 1/2001 |

(Continued)

OTHER PUBLICATIONS

Extended European Search Report dated Aug. 20, 2013 (in English) in counterpart European Application No. 13156742.2.

(Continued)

*Primary Examiner* — Khaja Ahmad
(74) *Attorney, Agent, or Firm* — Holtz, Holtz, Goodman & Chick PC

(57) ABSTRACT

According to one embodiment, a semiconductor light emitting device includes a semiconductor layer, a first electrode, a second electrode, a first interconnection section, a second interconnection section, and a varistor film. The semiconductor layer includes a light emitting layer. The first electrode is provided in a emitting region on the second surface. The second electrode is provided in a non-emitting region on the second surface. The first interconnection section is provided on the first electrode and electrically connected to the first electrode. The second interconnection section is provided on the second electrode and on the first electrode and electrically connected to the second electrode. The varistor film is provided in contact with the first electrode and the second interconnection section between the first electrode and the second interconnection section.

11 Claims, 16 Drawing Sheets

(51) Int. Cl.
*H01L 33/62* (2010.01)
*H01L 33/48* (2010.01)

(56) References Cited

U.S. PATENT DOCUMENTS

| | | |
|---|---|---|
| 2003/0127747 A1 | 7/2003 | Kajiwara et al. |
| 2003/0218851 A1 | 11/2003 | Harris et al. |
| 2004/0201941 A1 | 10/2004 | Harris et al. |
| 2005/0057867 A1* | 3/2005 | Harris et al. .................. 361/56 |
| 2005/0093008 A1* | 5/2005 | Suehiro et al. ................ 257/98 |
| 2006/0163604 A1 | 7/2006 | Shin et al. |
| 2007/0012940 A1 | 1/2007 | Suh et al. |
| 2007/0075323 A1 | 4/2007 | Kanazawa et al. |
| 2007/0081288 A1 | 4/2007 | Kanazawa et al. |
| 2007/0139848 A1 | 6/2007 | Harris et al. |
| 2007/0146941 A1 | 6/2007 | Harris et al. |
| 2008/0105885 A1 | 5/2008 | Watanabe et al. |
| 2010/0065785 A1 | 3/2010 | Kosowsky et al. |
| 2011/0233585 A1* | 9/2011 | Kojima et al. ................ 257/98 |
| 2011/0253430 A1 | 10/2011 | Woychik et al. |
| 2011/0291148 A1 | 12/2011 | Sugizaki et al. |
| 2011/0297985 A1* | 12/2011 | Naka .............................. 257/98 |
| 2011/0297986 A1* | 12/2011 | Nishiuchi et al. ............. 257/98 |
| 2011/0297987 A1* | 12/2011 | Koizumi et al. ............... 257/98 |
| 2011/0298001 A1* | 12/2011 | Akimoto et al. ............... 257/99 |
| 2011/0300644 A1 | 12/2011 | Akimoto et al. |

FOREIGN PATENT DOCUMENTS

| | | |
|---|---|---|
| JP | 2003-197673 A | 7/2003 |
| JP | 2004342885 A | 12/2004 |
| JP | 2005-136177 A | 5/2005 |
| JP | 2005184003 A | 7/2005 |
| JP | 2005-244220 A | 9/2005 |
| JP | 2006-228904 A | 8/2006 |
| JP | 2006-339559 A | 12/2006 |
| JP | 2007-27751 A | 2/2007 |
| JP | 2007-109683 A | 4/2007 |
| JP | 2008-108816 A | 5/2008 |
| JP | 2008-218592 A | 9/2008 |
| JP | 2009-152637 A | 7/2009 |
| JP | 2009-252930 A | 10/2009 |
| JP | 2011-114161 A | 6/2011 |
| JP | 2011-124333 A | 6/2011 |
| JP | 2011-155315 A | 8/2011 |
| JP | 2011-228704 A | 11/2011 |
| JP | 2011-251807 A | 12/2011 |
| JP | 2011249502 A | 12/2011 |
| JP | 2012015187 A | 1/2012 |
| JP | 2012-023328 A | 2/2012 |
| TW | 201143169 | 12/2011 |
| WO | WO 2007/058438 A1 | 5/2007 |

OTHER PUBLICATIONS

Japanese Office Action (and English translation thereof) dated Jun. 2, 2015, issued in counterpart Japanese Application No. 2012-120178.
Taiwanese Office Action dated May 18, 2015, issued in counterpart Taiwanese Application No. 102102896.

* cited by examiner

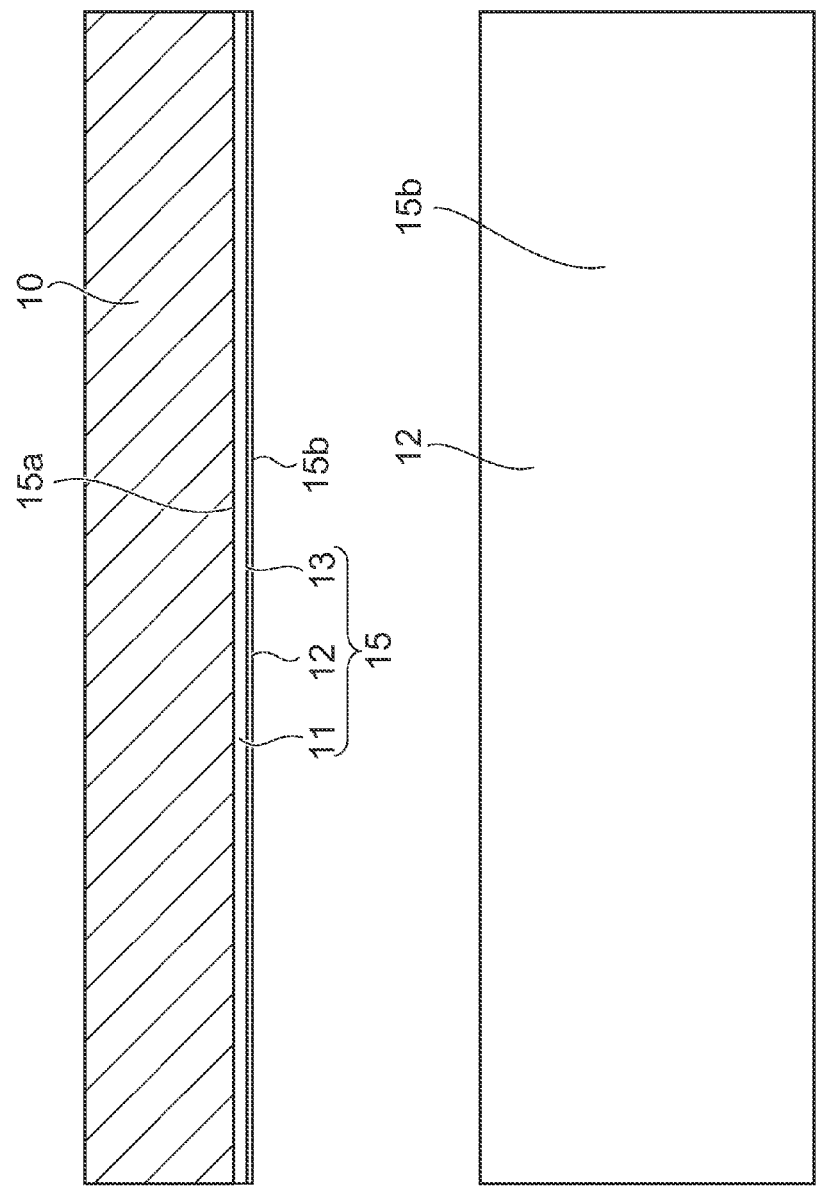

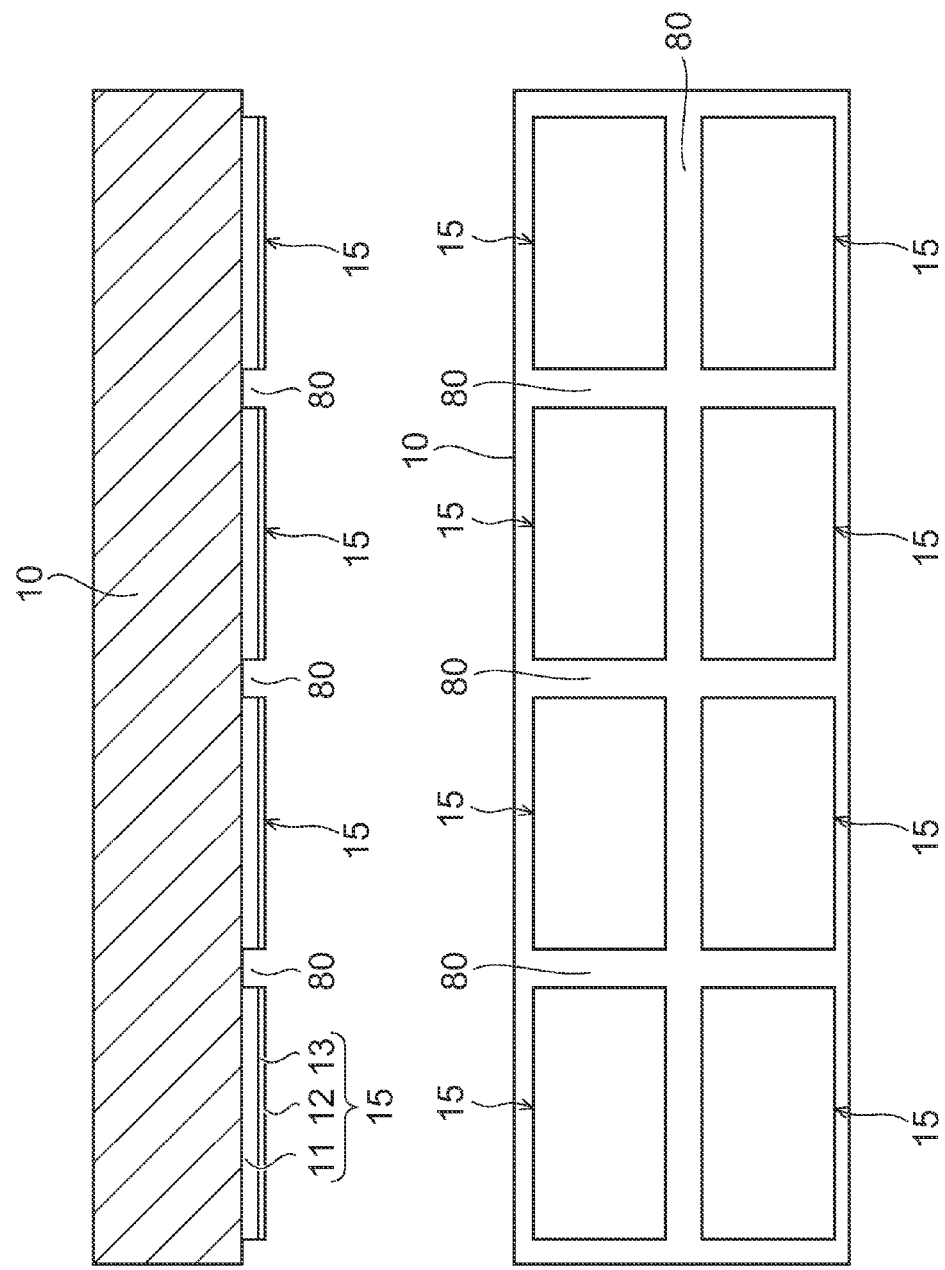

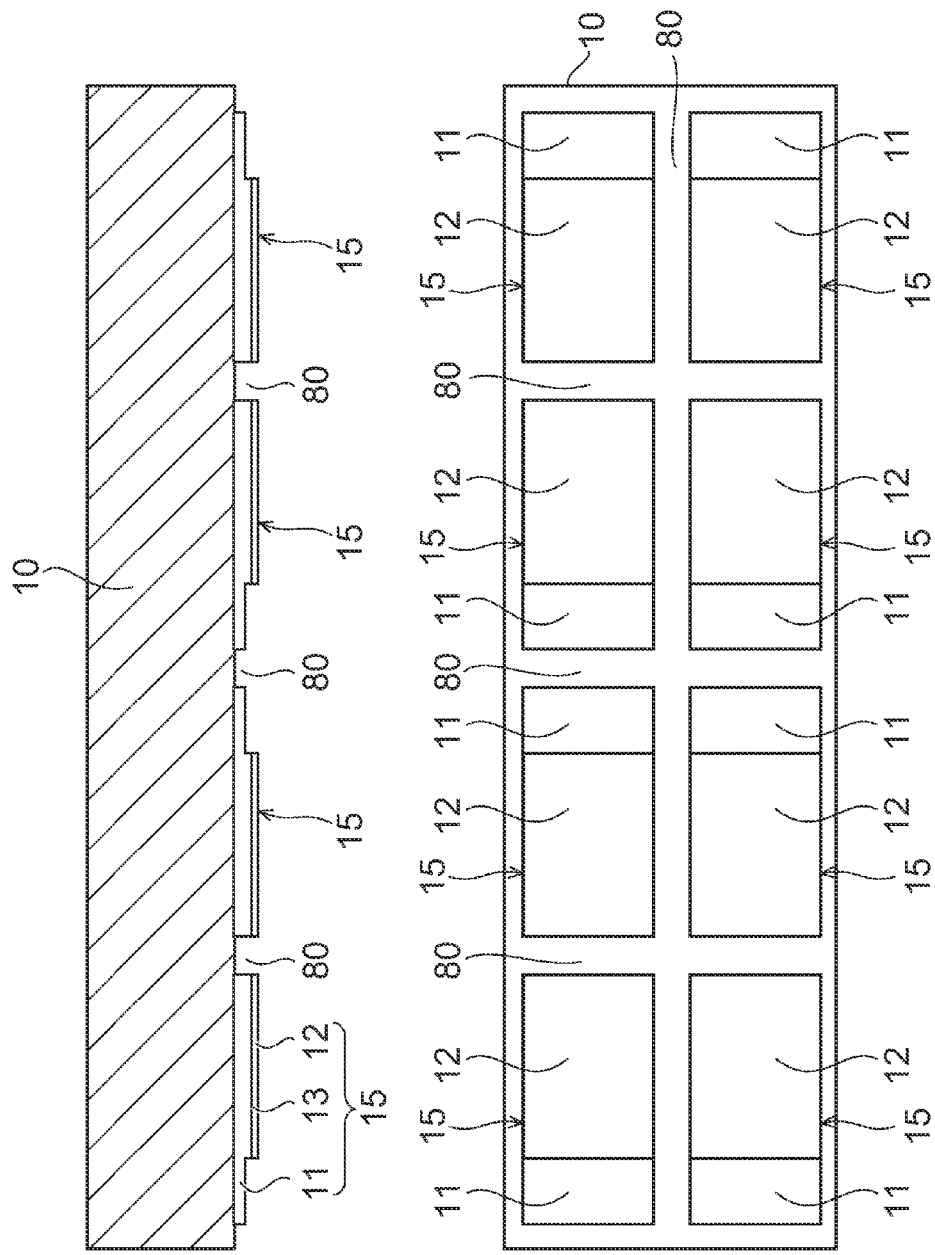

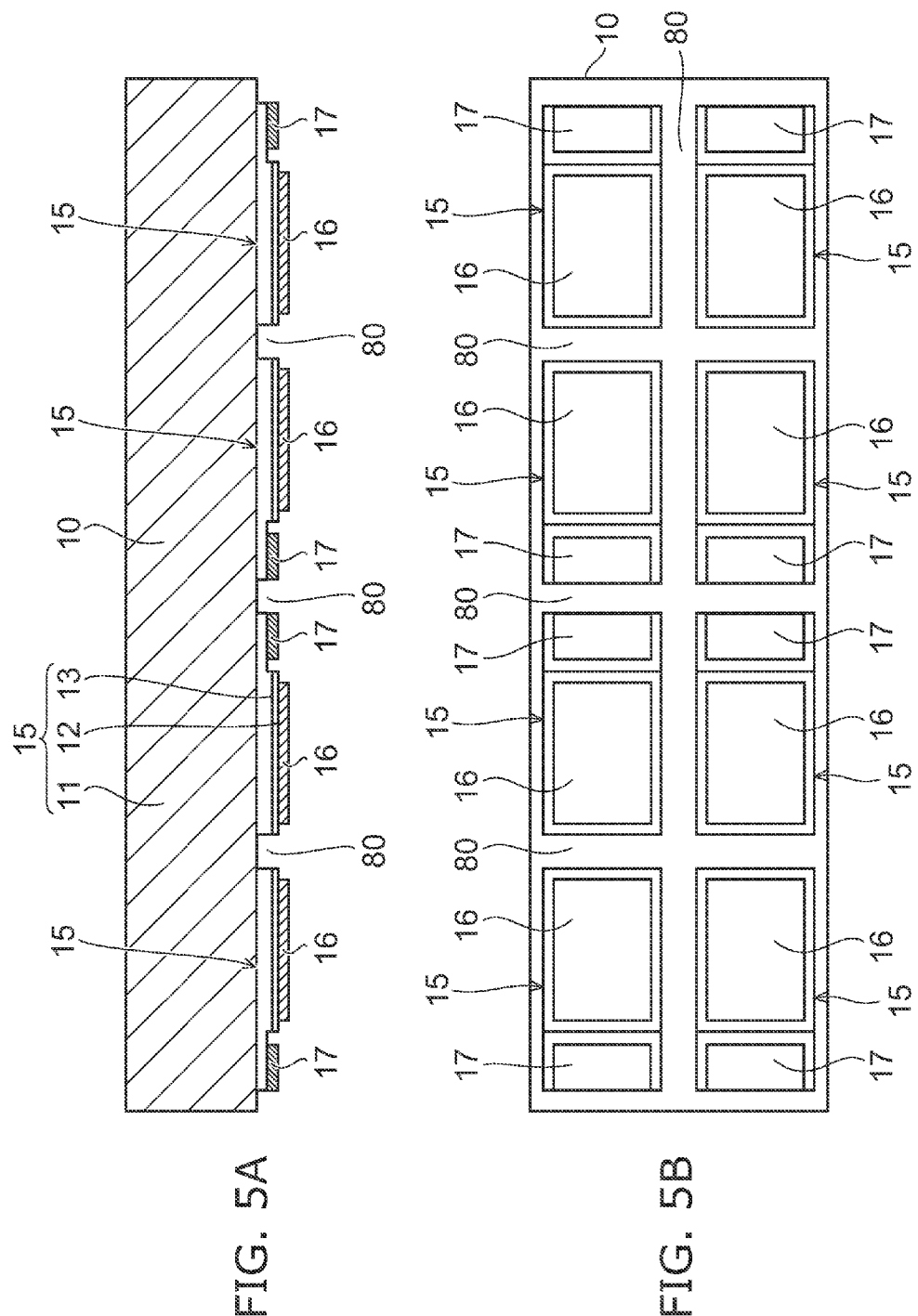

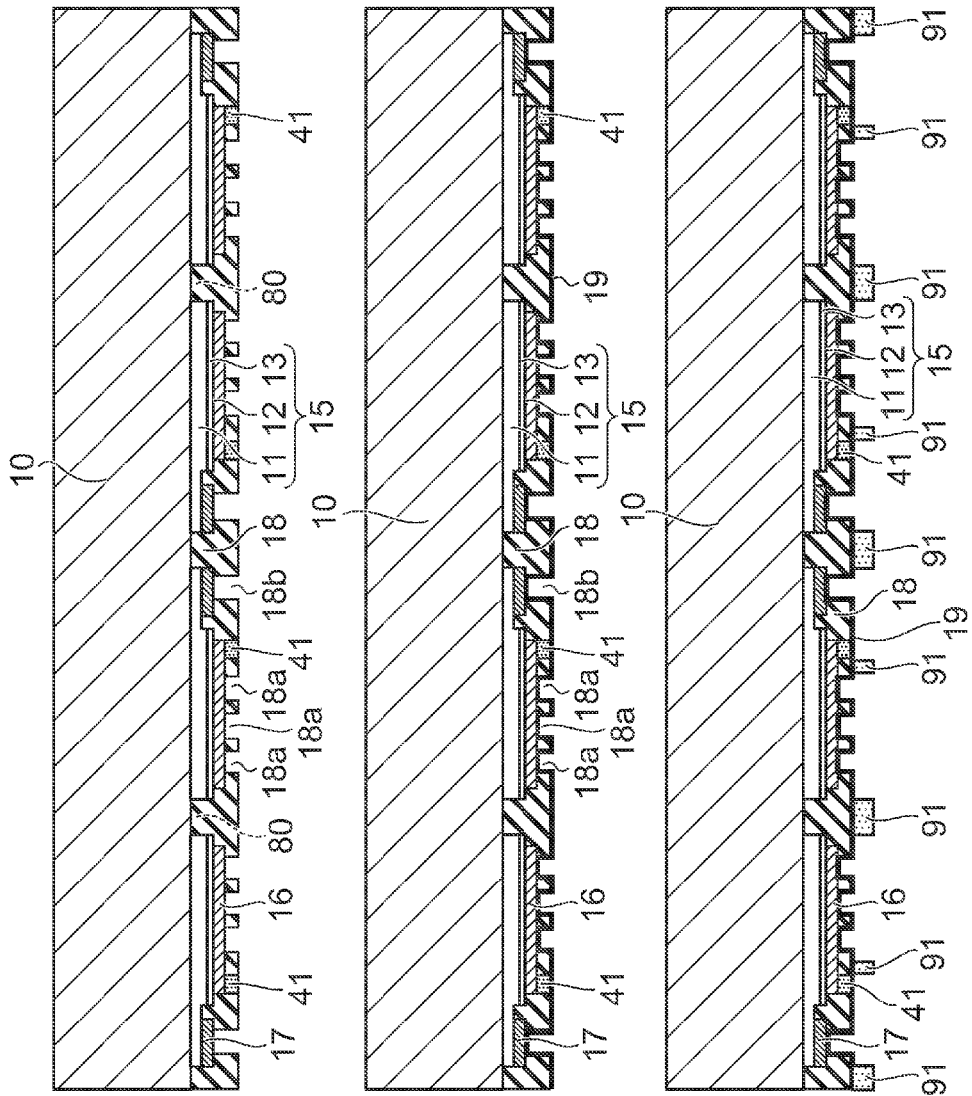

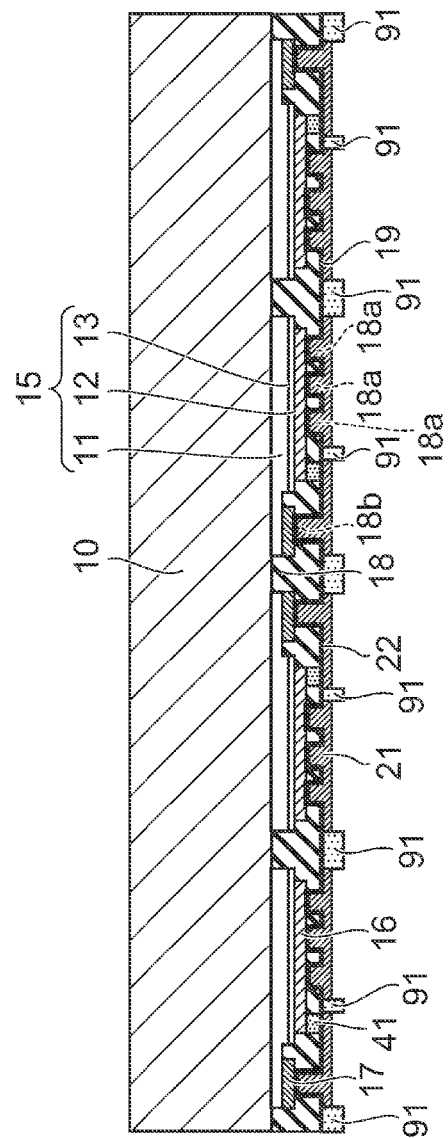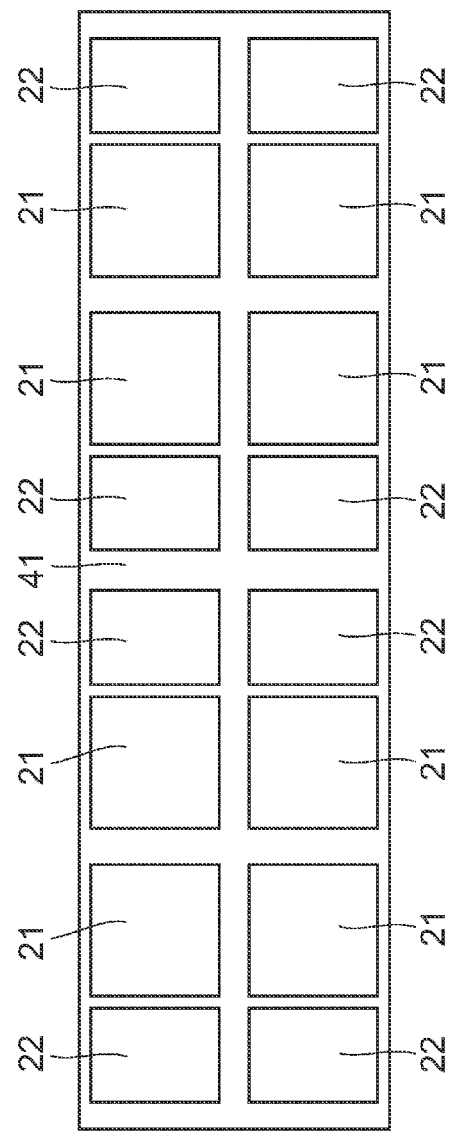
FIG. 7A
FIG. 7B

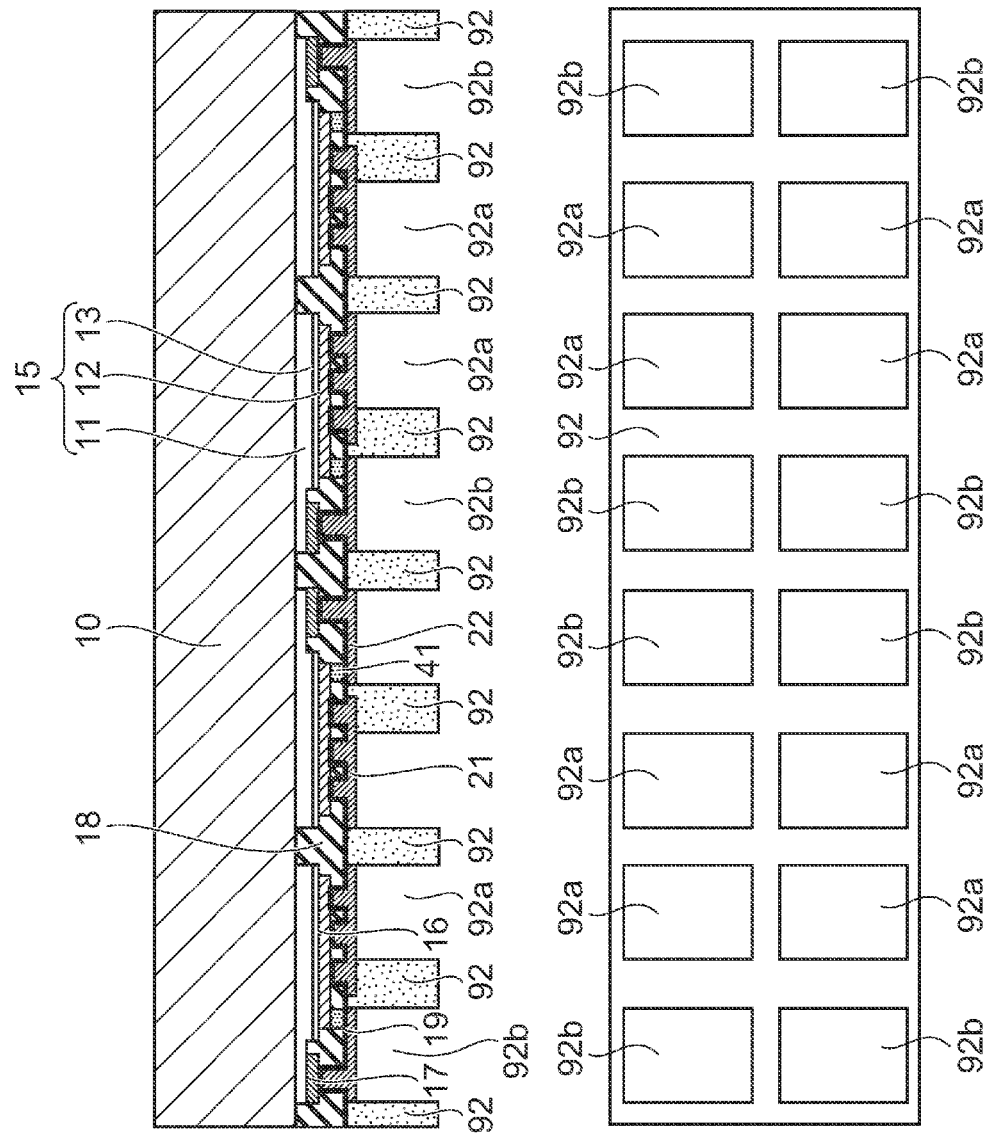

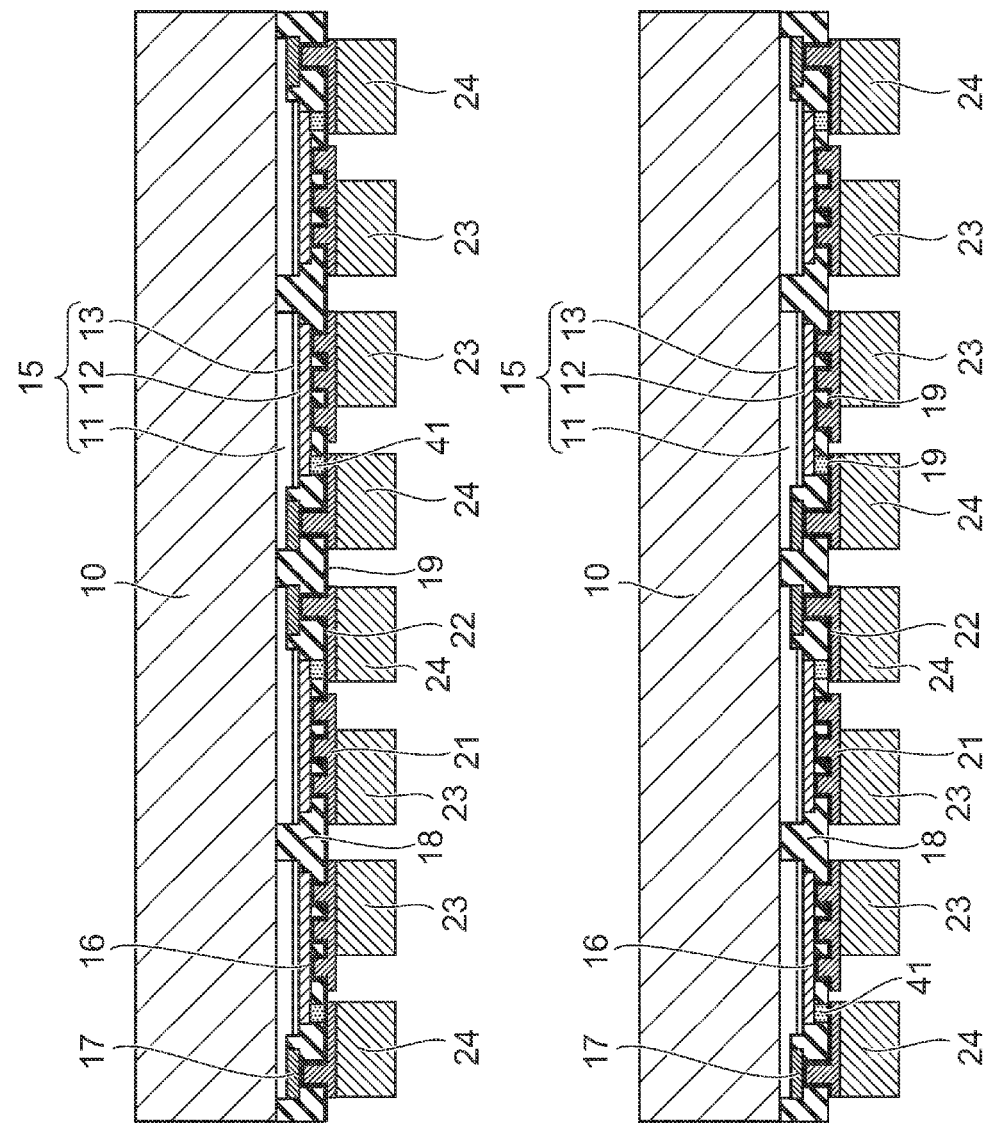

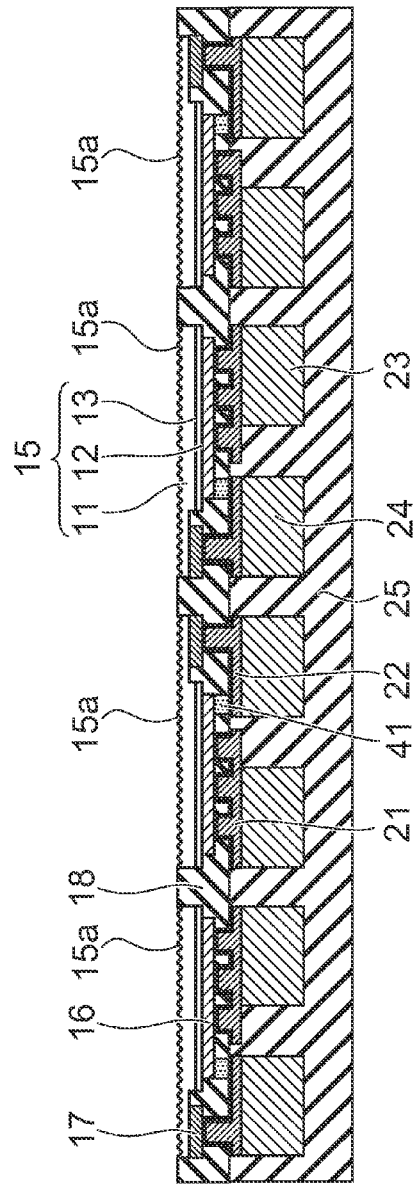
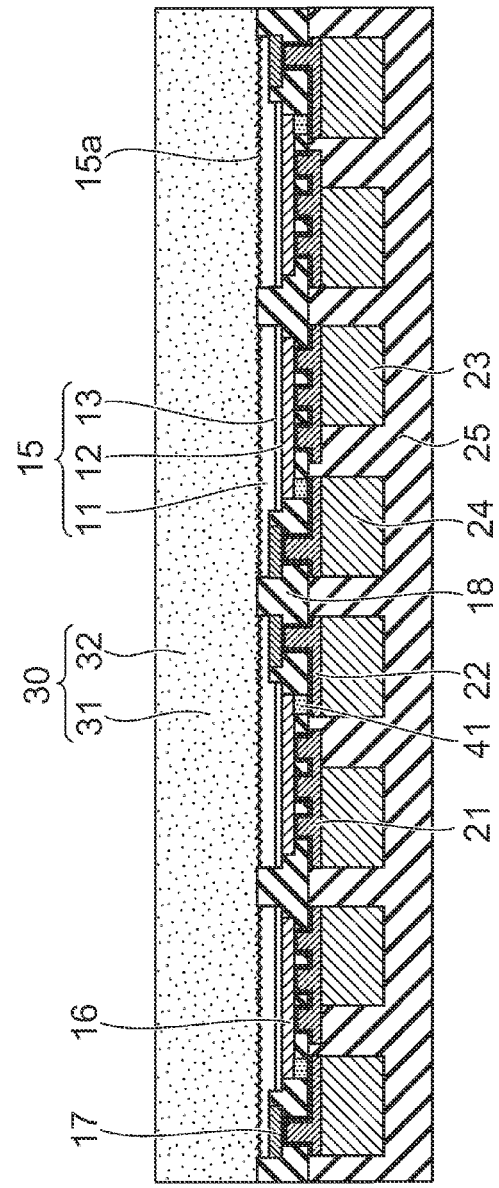
FIG. 12A
FIG. 12B

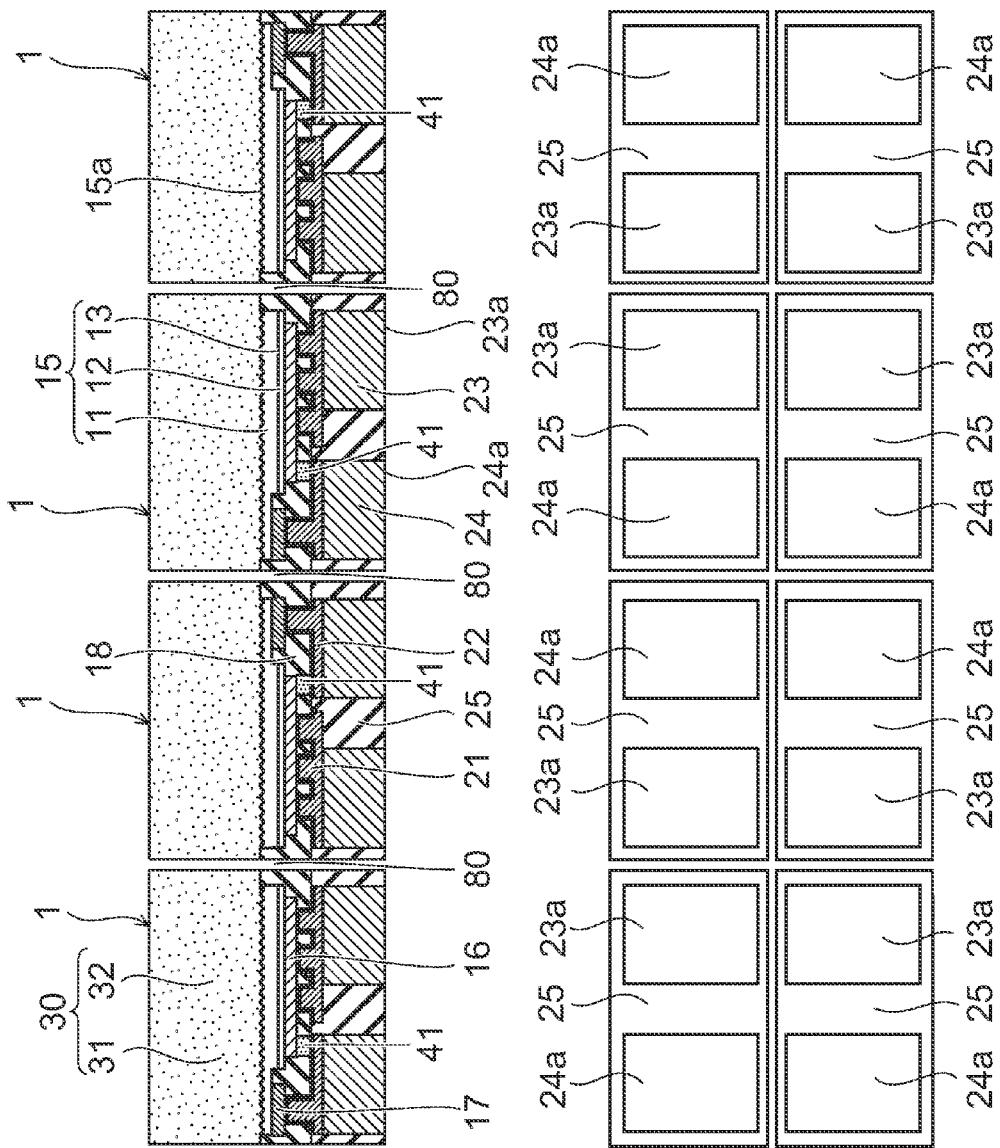

SEMICONDUCTOR LIGHT EMITTING DEVICE

CROSS-REFERENCE TO RELATED APPLICATION

This application is based upon and claims the benefit of priority from Japanese Patent Application No. 2012-120178, filed on May 25, 2012; the entire contents of which are incorporated herein by reference.

FIELD

Embodiments described herein relate generally to a semiconductor light emitting device.

BACKGROUND

Various structures for protecting an LED (light emitting diode) from ESD (electrostatic discharge) have been proposed. However, in an LED having a chip size package structure, there is demand for providing ESD resistance without hindrance to downsizing.

BRIEF DESCRIPTION OF THE DRAWINGS

FIG. 2A to FIG. 13B are schematic cross-sectional views showing a method for manufacturing the semiconductor light emitting device of the first embodiment;

DETAILED DESCRIPTION

Figure 1:
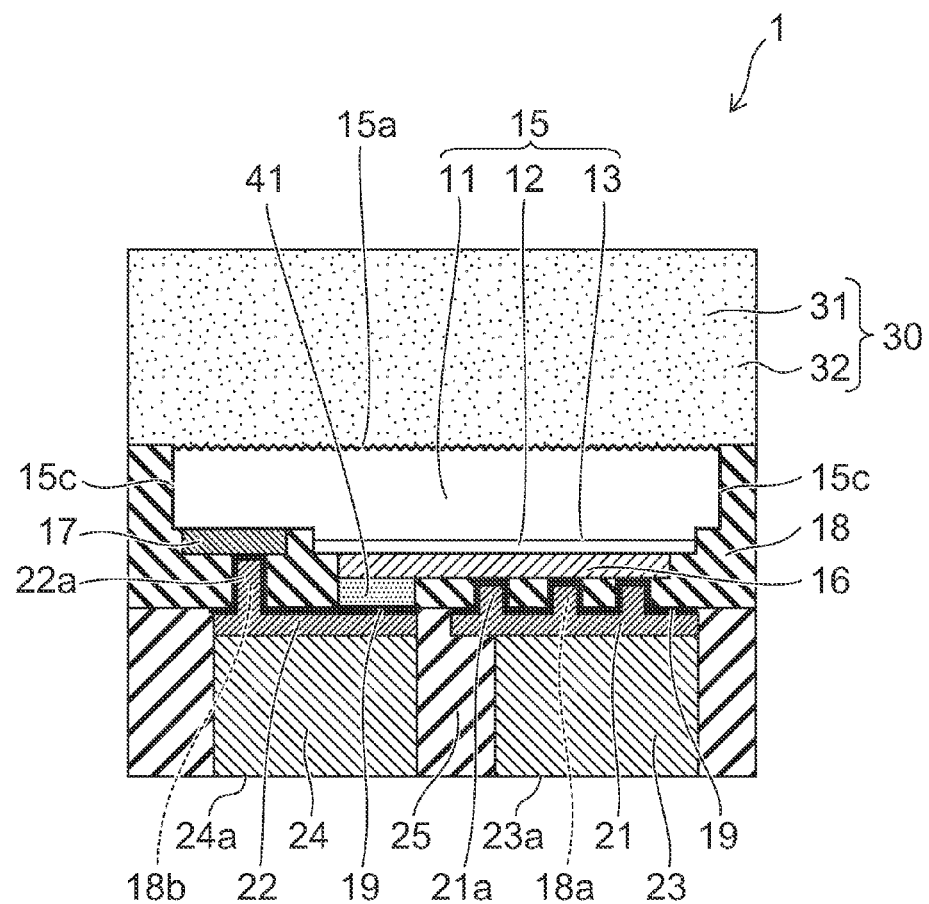
FIG. 1 is a schematic cross-sectional view of a semiconductor light emitting device of a first embodiment.

According to one embodiment, a semiconductor light emitting device includes a semiconductor layer, a first electrode, a second electrode, a first interconnection section, a second interconnection section, and a varistor film. The semiconductor layer includes a light emitting layer, a first surface, and a second surface opposite to the first surface. The first electrode is provided in a emitting region on the second surface. The second electrode is provided in a non-emitting region on the second surface. The first interconnection section is provided on the first electrode and electrically connected to the first electrode. The second interconnection section is provided on the second electrode and on the first electrode and electrically connected to the second electrode. The varistor film is provided in contact with the first electrode and the second interconnection section between the first electrode and the first interconnection section.

Embodiments will now be described with reference to the drawings. In the drawings, like elements are labeled with like reference numerals.

First Embodiment

FIG. 1 is a schematic sectional view of a semiconductor light emitting device 1 of a first embodiment.

The semiconductor light emitting device 1 includes a semiconductor layer 15. The semiconductor layer 15 includes a first surface 15a and a second surface provided on the opposite side from the first surface 15a. Furthermore, the semiconductor layer 15 includes a first semiconductor layer 11, a second semiconductor layer 12, and a light emitting layer 13.

The first semiconductor layer 11, the second semiconductor layer 12, and the light emitting layer 13 are all made of nitride semiconductor represented by $In_xAl_yGa_{1-x-y}N$ ($0 \leq x \leq 1$, $0 \leq y \leq 1$, $x+y \leq 1$). The "nitride semiconductor" also includes those doped with impurities for controlling the conductivity type.

The semiconductor layer 15 includes a emitting region in which the light emitting layer 13 and the second semiconductor layer 12 are stacked on the first semiconductor layer 11, and a non-emitting region not provided with the light emitting layer 13 and the second semiconductor layer 12 but consisting only of the first semiconductor layer 11. That is, the second surface of the semiconductor layer 15 includes a emitting region including the light emitting layer 13 and the second semiconductor layer 12, and a non-emitting region not including the light emitting layer 13 and the second semiconductor layer 12.

In the region including the light emitting layer 13 and the second semiconductor layer 12 on the second surface side of the semiconductor layer 15, the light emitting layer 13 is provided between the first semiconductor layer 11 and the second semiconductor layer 12.

As described later, the non-emitting region not including the light emitting layer 13 and the second semiconductor layer 12 on the second surface side of the semiconductor layer 15 is formed by selectively removing part of the light emitting layer 13 and the second semiconductor layer 12 formed on the entire surface of the first semiconductor layer 11 to expose the surface of the first semiconductor layer 11.

The first semiconductor layer 11 includes e.g. a foundation buffer layer and an n-type GaN layer. The light emitting layer (active layer) 13 has e.g. an InGaN-based multiple quantum well structure in which a plurality of pairs of an InGaN well layer and a GaN or InGaN barrier layer are stacked. The light emitting layer 13 emits e.g. blue, violet, blue-violet, or ultraviolet light. On the light emitting layer 13, the second semiconductor layer 12 including a p-type GaN layer is provided.

The first surface 15a functions as a light extraction surface. The emission light of the light emitting layer 13 is emitted from the first surface 15a primarily to the outside of the semiconductor layer 15. On the second surface side, a p-side electrode, an n-side electrode, a p-side interconnection section, and an n-side interconnection section described below are provided.

A p-side electrode 16 as a first electrode is provided on the surface of the second semiconductor layer 12. An n-side electrode 17 as a second electrode is provided on the surface of the first semiconductor layer 11 in the non-emitting region not including the light emitting layer 13 and the second semiconductor layer 12 on the second surface side of the semiconductor layer 15.

As shown in FIG. 5B, which is a plan view on the second surface side of the semiconductor layer 15, the p-side electrode 16 provided in the emitting region including the light emitting layer 13 has a larger area than the n-side electrode 17 provided in the region not including the light emitting layer 13. Thus, a large light emitting region is obtained. Here, the layout of the p-side electrode 16 and the n-side electrode 17 shown in FIG. 5B is illustrative only, and the embodiment is not limited thereto.

On the second surface side of the semiconductor layer 15, an insulating film 18 is provided. The insulating film 18 covers the semiconductor layer 15, the p-side electrode 16, and the n-side electrode 17. Furthermore, the insulating film 18 covers and protects the end surface (side surface) of the light emitting layer 13 and the second semiconductor layer 12.

Here, another insulating film (e.g., silicon oxide film) may be provided between the insulating film 18 and the semiconductor layer 15. The insulating film 18 is e.g. a resin such as polyimide, which is superior in patternability of fine openings. Alternatively, the insulating film 18 may be made of an inorganic film such as silicon oxide film and silicon nitride film.

The insulating film 18 is not provided on the first surface 15a of the semiconductor layer 15. The insulating film 18 covers and protects the side surface 15c of the semiconductor layer 15 continued from the first surface 15a.

On the surface of the insulating film 18 on the opposite side from the second surface of the semiconductor layer 15, a p-side interconnection layer 21 as a first interconnection layer and an n-side interconnection layer 22 as a second interconnection layer are provided and spaced from each other.

The p-side interconnection layer 21 and the n-side interconnection layer 22 are formed by the electrolytic plating technique as described later. The p-side interconnection layer 21 also includes a metal film 19 used as a seed metal for the plating. Similarly, the n-side interconnection layer 22 also includes a metal film 19 used as a seed metal.

The p-side interconnection layer 21 is provided on the p-side electrode 16 via the insulating film 18. In the insulating film 18, a plurality of first openings 18a reaching the p-side electrode 16 are formed. Through a plurality of first vias 21a provided in the first openings 18a, the p-side interconnection layer 21 is electrically connected to the p-side electrode 16.

The n-side interconnection layer 22 is provided on the n-side electrode 17 via the insulating film 18. Part of the n-side interconnection layer 22 extends on the insulating film 18 to the position opposed to the p-side electrode 16. The part of the n-side interconnection layer 22 is opposed to the p-side electrode 16 across a varistor film 41 described later.

In the insulating film 18, a second opening 18b reaching the n-side electrode 17 is formed. Through a second via 22a provided in the second opening 18b, the n-side interconnection layer 22 is electrically connected to the n-side electrode 17.

Between the p-side electrode 16 and the n-side interconnection layer 22, a varistor film 41 is provided. The varistor film 41 is in contact with the p-side electrode 16 and the n-side interconnection layer 22.

The varistor film 41 has a nonlinear resistance characteristic. The varistor film 41 is a film including at least one of e.g. BaTiO$_3$, SrTiO$_3$, ZnO, BiO, CoO, MnO, SbO, CrO, NiO, SiN, and SiO.

On the surface of the p-side interconnection layer 21 on the opposite side from the p-side electrode 16, a p-side metal pillar 23 as a first metal pillar is provided. The p-side interconnection layer 21 and the p-side metal pillar 23 constitute a p-side interconnection section (a first interconnection section) in this embodiment.

On the surface of the n-side interconnection layer 22 on the opposite side from the n-side electrode 17, an n-side metal pillar 24 as a second metal pillar is provided. The n-side interconnection layer 22 and the n-side metal pillar 24 constitute an n-side interconnection section (a second interconnection section) in this embodiment.

On the insulating film 18, a resin layer 25 is stacked as another insulating film. The resin layer 25 covers the periphery of the p-side interconnection section and the periphery of the n-side interconnection section. Furthermore, the resin layer 25 is filled between the p-side metal pillar 23 and the n-side metal pillar 24.

The side surface of the p-side metal pillar 23 and the side surface of the n-side metal pillar 24 are covered with the resin layer 25. The surface of the p-side metal pillar 23 on the opposite side from the p-side interconnection layer 21 is exposed from the resin layer 25 and functions as a p-side external terminal 23a. The surface of the n-side metal pillar 24 on the opposite side from the n-side interconnection layer 22 is exposed from the resin layer 25 and functions as an n-side external terminal 24a.

The p-side external terminal 23a and the n-side external terminal 24a are bonded with e.g. solder to pads formed on a mounting substrate, not shown.

The distance between the p-side external terminal 23a and the n-side external terminal 24a exposed at the same surface (the lower surface in FIG. 1) of the resin layer 25 is larger than the distance between the p-side interconnection layer 21 and the n-side interconnection layer 22 on the insulating film 18. The p-side external terminal 23a and the n-side external terminal 24a are separated by a distance such that no short circuit occurs therebetween by solder and the like at the time of mounting onto the mounting substrate.

The p-side interconnection layer 21 can be made close to the n-side interconnection layer 22 up to the process limit. This can expand the area of the p-side interconnection layer 21. As a result, the contact area between the p-side interconnection layer 21 and the p-side electrode 16 can be increased. This can improve the current distribution and heat dissipation.

The area of the p-side interconnection layer 21 being in contact with the p-side electrode 16 through the plurality of first vias 21a is larger than the area of the n-side interconnection layer 22 being in contact with the n-side electrode 17 through the second via 22a. This improves the current distribution to the light emitting layer 13, and can improve the heat dissipation of the light emitting layer 13.

The area of the n-side interconnection layer 22 extending on the insulating film 18 is larger than the area of the n-side interconnection layer 22 being in contact with the n-side electrode 17.

According to the first embodiment, the light emitting layer 13 is formed over a larger region than the n-side electrode 17. Thus, high optical output can be obtained. Furthermore, the n-side electrode 17 provided in a region smaller than the region including the light emitting layer 13 is extracted to the mounting surface side as an n-side interconnection layer 22 having a larger area.

The p-side metal pillar 23 is thicker than the p-side interconnection layer 21. The n-side metal pillar 24 is thicker than the n-side interconnection layer 22. Each thickness of the p-side metal pillar 23, the n-side metal pillar 24, and the resin layer 25 is thicker than the semiconductor layer 15. Here, the "thickness" represents the thickness in the vertical direction in FIG. 1.

Each thickness of the p-side metal pillar 23 and the n-side metal pillar 24 is thicker than the thickness of the stacked body including the semiconductor layer 15, the p-side electrode 16, the n-side electrode 17, and the insulating film 18. Here, the aspect ratio (ratio of thickness to planar size) of each metal pillar 23, 24 is not limited to being 1 or more. The ratio may be smaller than 1. That is, the metal pillar 23, 24 may have a thickness smaller than its planar size.

According to the embodiment, even if the substrate 10, described later, used to form the semiconductor layer 15 is removed, a support body including the p-side metal pillar 23, the n-side metal pillar 24, and the resin layer 25 stably supports the semiconductor layer 15. This can increase the mechanical strength of the semiconductor light emitting device 1.

The material of the p-side interconnection layer 21, the n-side interconnection layer 22, the p-side metal pillar 23, and the n-side metal pillar 24 can be e.g. copper, gold, nickel, or silver. Among them, use of copper achieves good thermal conductivity, high migration resistance, and good adhesiveness to insulating material.

The resin layer 25 reinforces the p-side metal pillar 23 and the n-side metal pillar 24. Preferably, the thermal expansion coefficient of the resin layer 25 is equal or close to that of the mounting substrate. Such a resin layer 25 can be made of e.g. epoxy resin, silicone resin, or fluororesin.

The semiconductor light emitting device 1 is mounted on a mounting substrate through the p-side external terminal 23a and the n-side external terminal 24a. In this state, the p-side metal pillar 23 and the n-side metal pillar 24 can absorb and relax the stress applied to the semiconductor layer 15 through solder.

The p-side interconnection section including the p-side interconnection layer 21 and the p-side metal pillar 23 is connected to the p-side electrode 16 through a plurality of vias 21a separated from each other. Thus, high stress relaxation effect is achieved by the p-side interconnection section.

Alternatively, the p-side interconnection layer 21 may be connected to the p-side electrode 16 through a via provided in one large first opening and having a larger planar size than the via 21a. In this case, heat dissipation of the light emitting layer 13 can be improved through the p-side electrode 16, the p-side interconnection layer 21, and the p-side metal pillar 23, all made of metal.

As described later, the substrate 10 used to form the semiconductor layer 15 is removed from above the first surface 15a. Thus, the semiconductor light emitting device 1 can be reduced in profile.

On the first surface 15a of the semiconductor layer 15, a fine unevenness is formed. On the first surface 15a, for instance, we etching with an alkaline solution (frost treatment) is performed to form an unevenness. By providing an unevenness on the first surface 15a, light incident on the first surface 15a at various angles can be extracted to the outside of the first surface 15a without total reflection.

On the first surface 15a, a phosphor layer 30 is provided. The phosphor layer 30 includes a transparent resin 31 as a transparent medium, and a plurality of particles of phosphor 32 dispersed in the transparent resin 31.

The transparent resin 31 is transparent to the excitation light of the light emitting layer 13 and the fluorescence of the phosphor 32. The transparent resin 31 can be made of e.g. silicone resin, acrylic resin, or phenyl resin.

The phosphor 32 can absorb the excitation light of the light emitting layer 13 and emit wavelength converted light. Thus, the semiconductor light emitting device 1 can emit mixed light of the excitation light of the light emitting layer 13 and the wavelength converted light of the phosphor 32.

For instance, the phosphor 32 can be a yellow phosphor emitting yellow light. Then, for instance, white color or light bulb color can be obtained as a mixed color of blue light of the light emitting layer 13 made of GaN-based material and yellow light being the wavelength converted light of the phosphor 32. The phosphor layer 30 may be configured to include a plurality of kinds of phosphors (e.g., a red phosphor emitting red light and a green phosphor emitting green light).

The first semiconductor layer 11 is electrically connected to the n-side external terminal 24a through the n-side electrode 17, the n-side interconnection layer 22, and the n-side metal pillar 24. The second semiconductor layer 12 is electrically connected to the p-side external terminal 23a through the p-side electrode 16, the p-side interconnection layer 21, and the p-side metal pillar 23.

According to the first embodiment, a varistor element is incorporated in the semiconductor light emitting device 1. In the varistor element, the p-side electrode 16 serves as one electrode, and the n-side interconnection layer 22 serves as the other electrode. That is, the semiconductor layer (chip) 15 and the varistor film 41 are parallel connected between the p-side external terminal 23a and the n-side external terminal 24a. The varistor film 41 functions as a protective element for protecting the semiconductor layer 15 from surge voltage. The surge current can flow between the p-side external terminal 23a and the n-side external terminal 24a through the varistor film 41 without passing through the semiconductor layer 15.

In the normal operation, a voltage less than or equal to the rated voltage is applied between the p-side external terminal 23a and the n-side external terminal 24a. In this case, the varistor film 41 is in the high resistance state. Thus, no short circuit occurs through the varistor film 41 between the p-side electrode 16 and the n-side interconnection layer 22.

When a voltage (surge voltage) larger than the rated voltage surges into the p-side external terminal 23a or the n-side external terminal 24a, a voltage larger than the rated voltage of the semiconductor light emitting device 1 is applied to the varistor film 41. Then, the electrical resistance of the varistor film 41 rapidly decreases. By the application of the above surge voltage, the varistor film 41 is subjected to breakdown earlier than the semiconductor layer 15.

Thus, the surge current can be passed between the p-side external terminal 23a and the n-side external terminal 24a through the p-side metal pillar 23, the p-side interconnection layer 21, the p-side electrode 16, the varistor film 41, the n-side interconnection layer 22, and the n-side metal pillar 24 without passing through the semiconductor layer 15 (light emitting layer 13). Thus, the semiconductor layer 15 can be protected from ESD.

The insulating film 18 and the resin layer 25 have higher breakdown voltage than the varistor film 41, and hence are not subjected to breakdown by the application of the above surge voltage.

According to the first embodiment, part of the insulating film 18 provided for insulation between the p-side electrode 16 and the n-side interconnection layer 22 is replaced by the varistor film 41. Thus, a semiconductor light emitting device 1 superior in ESD resistance can be provided without hindrance to downsizing of the semiconductor light emitting device 1 having a chip size package structure.

Next, with reference to FIGS. 2A to 13B, a method for manufacturing the semiconductor light emitting device 1 of the first embodiment is described. FIGS. 2A to 13B show a partial region in the wafer state.

FIG. 2A shows a stacked body in which a semiconductor layer 15 including a first semiconductor layer 11, a light emitting layer 13, and a second semiconductor layer 12 is formed on the major surface (the low surface in FIG. 2A) of a substrate 10. FIG. 2B corresponds to a bottom view in FIG. 2A.

A first semiconductor layer 11 is formed on the major surface of the substrate 10. A light emitting layer 13 is formed on the first semiconductor layer 11. A second semiconductor layer 12 is formed on the light emitting layer 13.

The semiconductor layer 15 is made of nitride semiconductor represented by $In_xAl_yGa_{1-x-y}N$ ($0 \leq x \leq 1$, $0 \leq y \leq 1$, x+y≤1). For instance, the semiconductor layer 15 can be crystal grown by the MOCVD (metal organic chemical vapor deposition) technique on a sapphire substrate. Alternatively, the substrate 10 can be a silicon substrate.

The surface of the first semiconductor layer 11 being in contact with the substrate 10 is the first surface 15a of the semiconductor layer 15. The surface of the second semiconductor layer 12 is the second surface 15b of the semiconductor layer 15.

Next, as shown in FIG. 3A and its bottom view, FIG. 3B, by e.g. the RIE (reactive ion etching) technique using a resist, not shown, a trench 80 penetrating through the semiconductor layer 15 to the substrate 10 is formed. The trench 80 is formed like e.g. a lattice on the substrate 10 in the wafer state. The trench 80 separates the semiconductor layer 15 into a plurality of chips on the substrate 10.

The step of separating the semiconductor layer 15 into a plurality may be performed after the selective removal of the second semiconductor layer 12 or after the formation of electrodes described later.

Next, as shown in FIG. 4A and its bottom view, FIG. 4B, by e.g. the RIE technique using a resist, not shown, part of the stacked film of the second semiconductor layer 12 and the light emitting layer 13 is removed to expose part of the first semiconductor layer 11. The region in which the first semiconductor layer 11 is exposed does not include the light emitting layer 13.

Next, as shown in FIG. 5A and its bottom view, FIG. 5B, a p-side electrode 16 and an n-side electrode 17 are formed on the second surface of the semiconductor layer 15. The p-side electrode 16 is formed on the surface of the second semiconductor layer 12. The n-side electrode 17 is formed on the exposed surface of the first semiconductor layer 11.

The p-side electrode 16 and the n-side electrode 17 are formed by e.g. a technique such as sputtering and evaporation. Either of the p-side electrode 16 and the n-side electrode 17 may be formed first. The p-side electrode 16 and the n-side electrode 17 may be simultaneously formed from the same material.

The p-side electrode 16 includes e.g. silver, silver alloy, aluminum, or aluminum alloy, being reflective to the emission light of the light emitting layer 13. In order to prevent sulfuration and oxidation of the p-side electrode 16, the p-side electrode 16 may be configured to include a metal protective film (barrier metal).

Furthermore, between the p-side electrode 16 and the n-side electrode 17, and on the end surface of the light emitting layer 13, a silicon nitride film or silicon oxide film, for instance, may be formed as a passivation film by the CVD (chemical vapor deposition) technique. Furthermore, activation annealing and the like for providing ohmic contact between each electrode and the semiconductor layer are performed as necessary.

Next, all the exposed portions on the major surface of the substrate 10 are covered with an insulating film 18 shown in FIG. 6A. Then, part of the insulating film 18 on the p-side electrode 16 is removed to expose part of the p-side electrode 16. On this exposed part of the p-side electrode 16, a varistor film 41 is formed.

The varistor film 41 is formed by e.g. the sputtering technique. After the film formation, the varistor film 41 is locally heated by laser annealing. Thus, an appropriate nonlinear resistance characteristic can be provided to the varistor film 41 without degrading the semiconductor layer 15.

Alternatively, after selectively forming a varistor film 41 on the p-side electrode 16 in advance, an insulating film 18 may be formed.

The insulating film 18 is patterned by e.g. wet etching. Thus, a first opening 18a and a second opening 18b are selectively formed in the insulating film 18. The first opening 18a is formed in a plurality. Each first opening 18a reaches the p-side electrode 16. The second opening 18b reaches the n-side electrode 17.

The insulating film 18 can be made of e.g. an organic material such as photosensitive polyimide and benzocyclobutene. In this case, the insulating film 18 can be directly subjected to light exposure and development without using a resist.

Alternatively, an inorganic film such as silicon nitride film and silicon oxide film may be used as the insulating film 18. In the case where the insulating film 18 is an inorganic film, a resist formed on the insulating film 18 is patterned and then etched to form first openings 18a and a second opening 18b.

Next, as shown in FIG. 6B, a metal film 19 is formed on the surface of the insulating film 18, the inner wall (sidewall and bottom) of the first opening 18a, and the inner wall (sidewall and bottom) of the second opening 18b. The metal film 19 is used as a seed metal for plating described later.

The metal film 19 is formed by e.g. the sputtering technique. The metal film 19 includes e.g. a stacked film of titanium (Ti) and copper (Cu) stacked sequentially from the insulating film 18 side. Alternatively, the titanium film may be replaced by an aluminum film.

Next, as shown in FIG. 6C, a resist 91 is selectively formed on the metal film 19. Cu electrolytic plating is performed using the metal film 19 as a current path.

Thus, as shown in FIG. 7A and its bottom view, FIG. 7B, a p-side interconnection layer 21 and an n-side interconnection layer 22 are selectively formed on the metal film 19. The p-side interconnection layer 21 and the n-side interconnection layer 22 are made of e.g. a copper material formed simultaneously by the plating technique.

The p-side interconnection layer 21 is formed also in the first opening 18a. The p-side interconnection layer 21 is electrically connected to the p-side electrode 16 through the metal film 19. The n-side interconnection layer 22 is formed also in the second opening 18b. The n-side interconnection layer 22 is electrically connected to the n-side electrode 17 through the metal film 19.

The n-side interconnection layer 22 is formed so as to extend onto the varistor film 41. Thus, the varistor film 41 is sandwiched between the p-side electrode 16 and the n-side interconnection layer 22.

The resist 91 used for the plating of the p-side interconnection layer 21 and the n-side interconnection layer 22 is removed with solvent or oxygen plasma.

Next, as shown in FIG. 8A and its bottom view, FIG. 8B, a resist 92 for forming a metal pillar is formed. The resist 92 is thicker than the aforementioned resist 91. Here, the resist 91 may be left without removal in the previous step, and the resist 92 may be stacked on the resist 91. The resist 92 includes a first opening 92a and a second opening 92b.

Figures 9A, 9B:
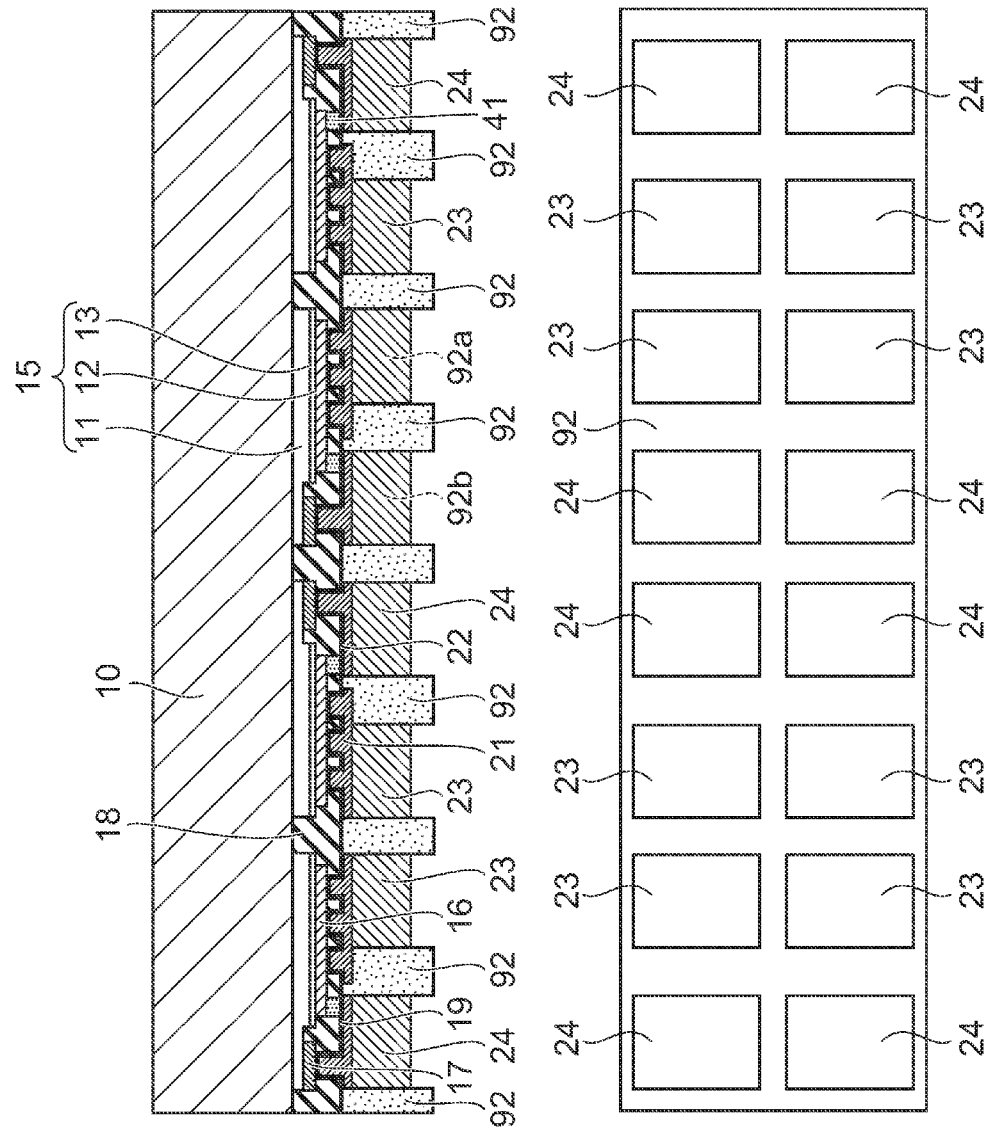

Then, the resist 92 is used as a mask to perform Cu electrolytic plating using the metal film 19 as a current path. Thus, as shown in FIG. 9A and its bottom view, FIG. 9B, a p-side metal pillar 23 and an n-side metal pillar 24 are formed.

The p-side metal pillar 23 is formed on the surface of the p-side interconnection layer 21 in the first opening 92a formed in the resist 92. The n-side metal pillar 24 is formed on the surface of the n-side interconnection layer 22 in the second opening 92b formed in the resist 92. The p-side metal pillar 23 and the n-side metal pillar 24 are made of e.g. a copper material formed simultaneously by the plating technique.

As shown in FIG. 10A, the resist 92 is removed with e.g. solvent or oxygen plasma. Then, the metal pillar 23, the n-side metal pillar 24, the p-side interconnection layer 21, and the n-side interconnection layer 22 are used as a mask to remove the exposed portion of the metal film 19 by we etching. Thus, as shown in FIG. 10B, the electrical connection between the p-side interconnection layer 21 and the n-side interconnection layer 22 through the metal film 19 is broken.

Figures 11A, 11B:
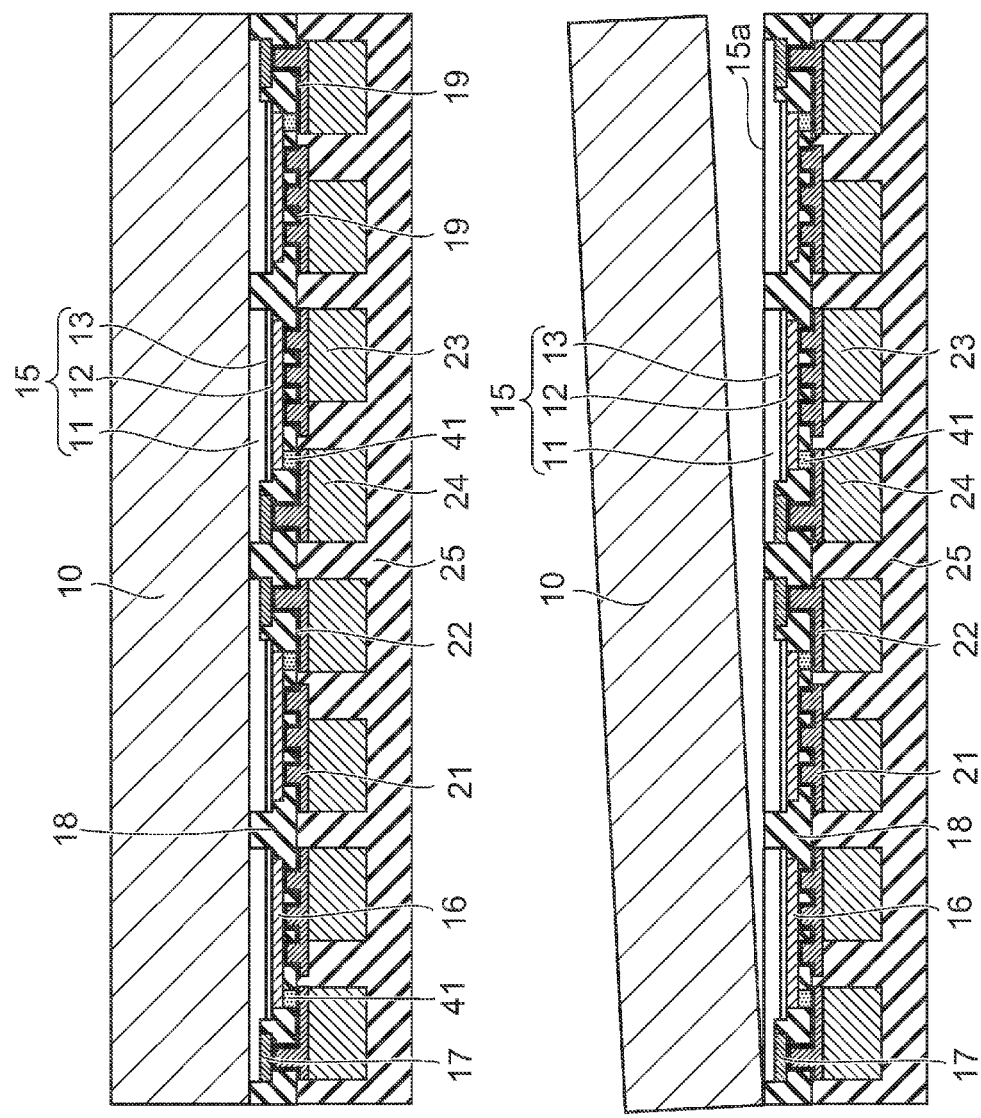

Next, as shown in FIG. 11A, a resin layer 25 is stacked on the insulating film 18. The resin layer 25 covers the p-side interconnection layer 21, the n-side interconnection layer 22, the p-side metal pillar 23, and the n-side metal pillar 24.

The resin layer 25 has an insulating property. Furthermore, carbon black, for instance, may be contained in the resin layer 25 to achieve a light blocking property for the emission light of the light emitting layer 13.

Next, as shown in FIG. 11B, the substrate 10 is removed. In the case where the substrate 10 is a sapphire substrate, the substrate 10 can be removed by e.g. the laser lift-off technique. Specifically, laser light is applied from the rear surface side of the substrate 10 toward the first semiconductor layer 11. The laser light has a wavelength which can be transmitted through the substrate 10 and which resides in the absorption region of the first semiconductor layer 11.

When the laser light reaches the interface between the substrate 10 and the first semiconductor layer 11, the first semiconductor layer 11 near the interface is decomposed by absorbing the energy of the laser light. The first semiconductor layer 11 is decomposed into gallium (Ga) and nitrogen gas. By this decomposition reaction, a small gap is formed between the substrate 10 and the first semiconductor layer 11. Thus, the substrate 10 and the first semiconductor layer 11 are separated.

The laser light irradiation is performed throughout the wafer a plurality of times, once for each predefined region. Thus, the substrate 10 is removed.

In the case where the substrate 10 is a silicon substrate, the substrate 10 can be removed by etching.

The aforementioned stacked body formed on the major surface of the substrate 10 is reinforced by the p-side metal pillar 23, the n-side metal pillar 24, and the resin layer 25, which are thicker than the semiconductor layer 15. Thus, even if the substrate 10 is eliminated, the wafer state can be maintained.

The resin layer 25 and the metal constituting the p-side metal pillar 23 and the n-side metal pillar 24 are both made of softer materials than the semiconductor layer 15. The semiconductor layer 15 is supported by such a soft support body. This can avoid destruction of the semiconductor layer 15 even if a large internal stress produced by epitaxial growth of the semiconductor layer 15 on the substrate 10 is released at once when the substrate 10 is removed.

After the substrate 10 is removed, the first surface 15a of the semiconductor layer 15 is cleaned. For instance, gallium (Ga) attached to the first surface 15a is removed with e.g. dilute hydrofluoric acid.

Then, the first surface 15a is we etched with e.g. KOH (potassium hydroxide) aqueous solution or TMAH (tetramethylammonium hydroxide). Thus, as shown in FIG. 12A, an unevenness is formed on the first surface 15a due to difference in etching rate depending on the crystal surface orientation. Alternatively, an unevenness may be formed on the first surface 15a by patterning with a resist followed by etching. The unevenness formed on the first surface 15a can increase the light extraction efficiency.

Next, as shown in FIG. 12B, a phosphor layer 30 is formed on the first surface 15a. The phosphor layer 30 is formed also on the insulating film 18 between the adjacent semiconductor layers 15.

A liquid transparent resin 31 dispersed with phosphor 32 is supplied onto the first surface 15a by a method such as printing, potting, molding, and compression molding, and then heat cured.

Next, the surface (the lower surface in FIG. 12B) of the resin layer 25 is ground. Thus, as shown in FIG. 13A and its bottom view, FIG. 13B, a p-side external terminal 23a and an n-side external terminal 24a are exposed.

Then, the phosphor layer 30, the insulating film 18, and the resin layer 25 are cut at the position of the aforementioned trench 80 and singulated into a plurality of semiconductor light emitting devices 1.

At the time of dicing, the substrate 10 has already been removed. Furthermore, the semiconductor layer 15 does not exist in the trench 80. This can avoid damage to the semiconductor layer 15 at the time of dicing. Furthermore, a structure in which the end portion (side surface) of the semiconductor layer 15 is covered and protected with the insulating film 18 is obtained without additional steps after singulation.

The singulated semiconductor light emitting device 1 may have a single chip structure including one semiconductor layer 15, or a mufti-chip structure including a plurality of semiconductor layers 15.

The above steps before dicing are collectively performed in the wafer state. Thus, there is no need to perform interconnection and packaging for each singulated device. This can significantly reduce the production cost. That is, in the singulated state, interconnection and packaging have already been completed. This can improve the productivity. As a result, cost reduction is facilitated.

Second Embodiment

Figure 14:
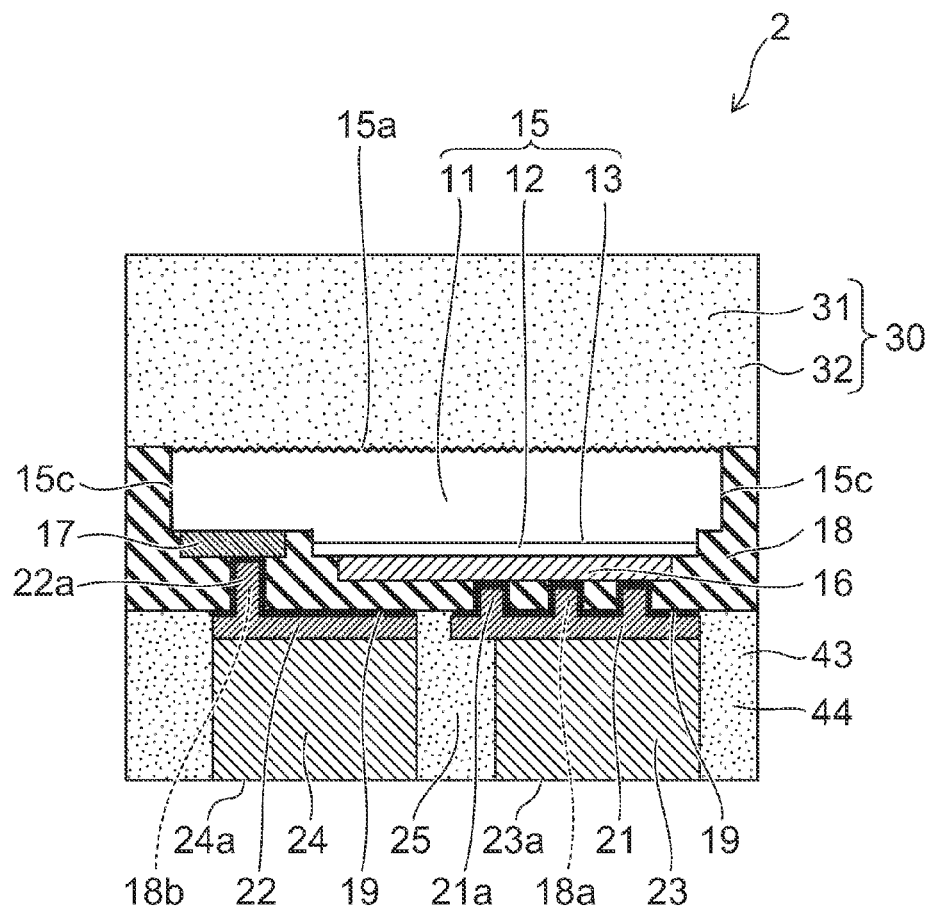
FIG. 14 is a schematic cross-sectional view of a semiconductor light emitting device of a second embodiment.

FIG. 14 is a schematic sectional view of a semiconductor light emitting device 2 of a second embodiment.

As in the first embodiment, the semiconductor light emitting device 2 of the second embodiment also includes a semiconductor layer 15 including a first semiconductor layer 11, a second semiconductor layer 12, and a light emitting layer 13.

The p-side electrode 16 is provided on the surface of the second semiconductor layer 12. The n-side electrode 17 is provided on the surface of the first semiconductor layer 11 in the region not including the light emitting layer 13 and the second semiconductor layer 12 on the second surface side of the semiconductor layer 15.

The insulating film 18 covers the semiconductor layer 15, the p-side electrode 16, and the n-side electrode 17. Furthermore, the insulating film 18 covers and protects the end surface (side surface) of the light emitting layer 13 and the second semiconductor layer 12.

On the surface of the insulating film 18 on the opposite side from the second surface of the semiconductor layer 15, a p-side interconnection layer 21 and an n-side interconnection layer 22 are provided and spaced from each other.

The p-side interconnection layer 21 is electrically connected to the p-side electrode 16 through a plurality of first vias 21a.

The n-side interconnection layer 22 is provided on the n-side electrode 17 via the insulating film 18. Part of the n-side interconnection layer 22 extends on the insulating film 18 to the position opposed to the p-side electrode 16. The n-side interconnection layer 22 is electrically connected to the n-side electrode 17 through a second via 22a.

A p-side metal pillar 23 is provided on the p-side interconnection layer 21. An n-side metal pillar 24 is provided on the n-side interconnection layer 22.

A resin layer 25 is stacked on the insulating film 18. The resin layer 25 is filled between the p-side interconnection layer 21 and the n-side interconnection layer 22, and between the p-side metal pillar 23 and the n-side metal pillar 24. The resin layer 25 covers the periphery of the p-side interconnection layer 21, the periphery of the n-side interconnection layer 22, the periphery of the p-side metal pillar 23, and the periphery of the n-side metal pillar 24.

The resin layer 25 is dispersed with a plurality of varistor particles 43 and a plurality of conductive particles 44.

The varistor particle 43 is a particle made of e.g. $BaTiO_3$, $SrTiO_3$, ZnO, BiO, CoO, MnO, SbO, CrO, NiO, SiN, or SiO.

The conductive particle 44 has a lower electrical resistance than the varistor particle 43. This facilitates electrical connection between the varistor particles 43 through the conductive particles 44 at the time of application of surge voltage. The conductive particle 44 is e.g. a gold particle.

The surface of the p-side metal pillar 23 on the opposite side from the p-side interconnection layer 21 is exposed from the resin layer 25 and functions as a p-side external terminal 23a. The surface of the n-side metal pillar 24 on the opposite side from the n-side interconnection layer 22 is exposed from the resin layer 25 and functions as an n-side external terminal 24a.

The p-side external terminal 23a and the n-side external terminal 24a are bonded with e.g. solder to pads formed on a mounting substrate, not shown.

Also in the second embodiment, even if the substrate 10, described later, used to form the semiconductor layer 15 is removed, a support body including the p-side metal pillar 23, the n-side metal pillar 24, and the resin layer 25 stably supports the semiconductor layer 15. This can increase the mechanical strength of the semiconductor light emitting device 2.

The semiconductor light emitting device 2 is mounted on a mounting substrate through the p-side external terminal 23a and the n-side external terminal 24a. In this state, the p-side metal pillar 23 and the n-side metal pillar 24 can absorb and relax the stress applied to the semiconductor layer 15 through solder.

Furthermore, as in the first embodiment, on the first surface 15a, a phosphor layer 30 is provided. The phosphor layer 30 includes a transparent resin 31 and a plurality of particles of phosphor 32 dispersed in the transparent resin 31. Thus, the semiconductor light emitting device 2 of the second embodiment can also emit mixed light of the excitation light of the light emitting layer 13 and the wavelength converted light of the phosphor 32.

According to the second embodiment, the resin layer 25 dispersed with varistor particles 43 can function as a varistor element having a nonlinear resistance characteristic. The p-side interconnection section including the p-side interconnection layer 21 and the p-side metal pillar 23 functions as one electrode of the varistor element. The n-side interconnection section including the n-side interconnection layer 22 and the n-side metal pillar 24 functions as the other electrode of the varistor element.

An insulating film 18 not including varistor particles is provided between the p-side electrode 16 and the resin layer 25, and between the n-side electrode 17 and the resin layer 25. Thus, at the time of application of surge voltage, no short circuit occurs through the resin layer 25 between the p-side electrode 16 and the n-side electrode 17.

In the semiconductor light emitting device 2 of the second embodiment, the semiconductor layer (chip) 15 and the varistor element are parallel connected between the p-side external terminal 23a and the n-side external terminal 24a. The surge current can flow between the p-side external terminal 23a and the n-side external terminal 24a through the resin layer 25 functioning as a varistor element without passing through the semiconductor layer 15.

In the normal operation, a voltage less than or equal to the rated voltage is applied between the p-side external terminal 23a and the n-side external terminal 24a. In this case, the varistor particles 43 and the resin layer 25 including the varistor particles 43 are in the high resistance state. Thus, no short circuit occurs through the resin layer 25 between the p-side interconnection section and the n-side interconnection section.

When a voltage (surge voltage) larger than the rated voltage surges into the p-side external terminal 23a or the n-side external terminal 24a, a voltage larger than the rated voltage of the semiconductor light emitting device 2 is applied to the varistor particles 43. Then, the electrical resistance of the varistor particles 43 and the resin layer 25 including the varistor particles 43 rapidly decrease. By the application of the above surge voltage, the varistor particles 43 and the resin layer 25 including the varistor particles 43 are subjected to breakdown earlier than the semiconductor layer 15.

Thus, the surge current can be passed between the p-side external terminal 23a and the n-side external terminal 24a through the resin layer 25 between the p-side interconnection section and the n-side interconnection section without passing through the semiconductor layer 15 (light emitting layer 13). Thus, the semiconductor layer 15 can be protected from ESD.

According to the second embodiment, the resin layer 25 provided for insulation between and reinforcement of the p-side interconnection section and the n-side interconnection section can be used as a varistor element. Thus, a semiconductor light emitting device 2 superior in ESD resistance can be provided without hindrance to downsizing of the semiconductor light emitting device 2 having a chip size package structure.

Furthermore, the resin layer 25 is dispersed with conductive particles 44 in addition to varistor particles 43. This facilitates electrical connection between the varistor particles 43 at the time of application of surge voltage, and facilitates adjusting the voltage of short circuit between the p-side interconnection section and the n-side interconnection section through the resin layer 25.

Third Embodiment

Figure 15:
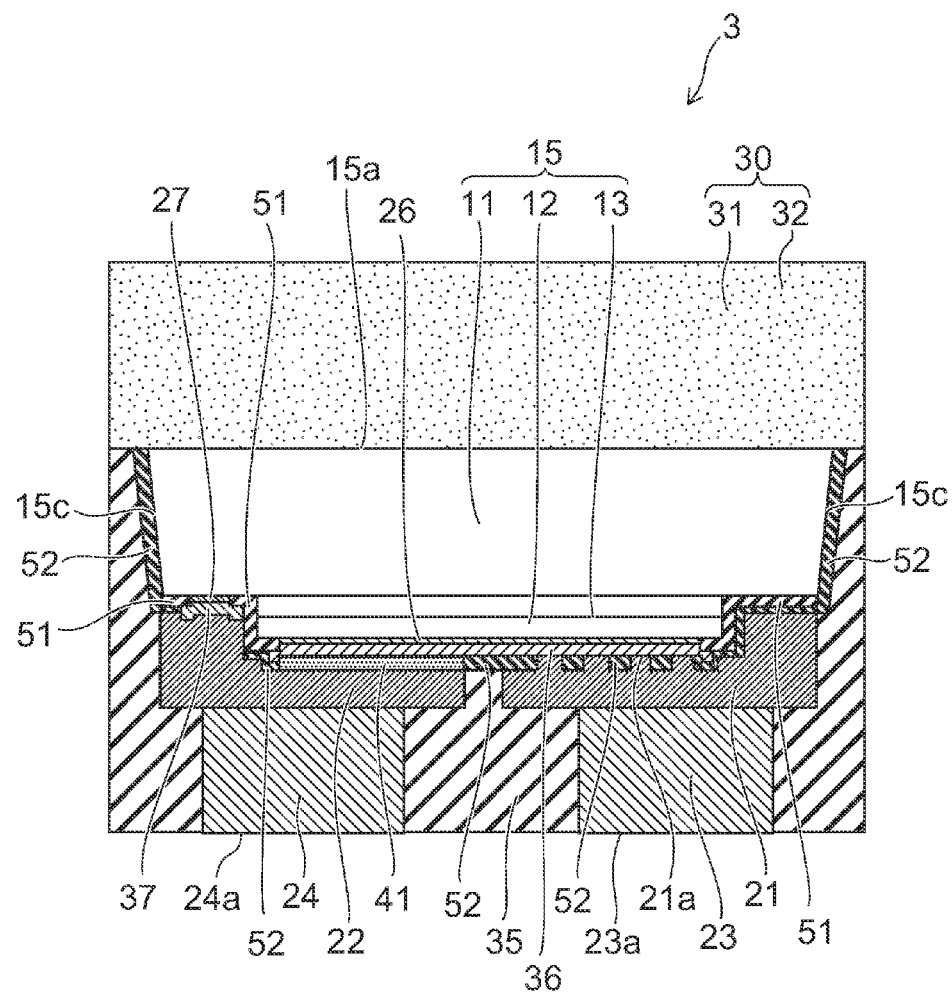
FIG. 15 is a schematic cross-sectional view of a semiconductor light emitting device of a third embodiment.

FIG. 15 is a schematic sectional view of a semiconductor light emitting device 3 of a third embodiment.

As in the above embodiments, the semiconductor light emitting device 3 of the third embodiment also includes a semiconductor layer 15 including a first semiconductor layer 11, a second semiconductor layer 12, and a light emitting layer 13.

The first surface 15a of the semiconductor layer 15 functions as a light extraction surface. The emission light of the light emitting layer 13 is emitted from the first surface 15a primarily to the outside of the semiconductor layer 15. On the second surface side, a p-side contact electrode, a p-side pad electrode, an n-side contact electrode, an n-side pad electrode, a p-side interconnection section, and an n-side interconnection section described below are provided.

The semiconductor layer 15 includes a region in which the light emitting layer 13 and the second semiconductor layer 12 are stacked on the first semiconductor layer 11, and a region not provided with the light emitting layer 13 and the second semiconductor layer 12 but consisting only of the first semiconductor layer 11. That is, the second surface of the semiconductor layer 15 includes a region including the light emitting layer 13 and the second semiconductor layer 12, and a region not including the light emitting layer 13 and the second semiconductor layer 12.

A p-side contact electrode 26 is provided on the surface of the second semiconductor layer 12. An n-side contact electrode 27 is provided on the surface of the first semiconductor layer 11 in the region not including the light emitting layer 13 and the second semiconductor layer 12 on the second surface side of the semiconductor layer 15.

A p-side pad electrode 36 is provided on the p-side contact electrode 26. The planar size of the p-side pad electrode 36 is larger than the planar size of the p-side contact electrode 26. The p-side pad electrode 36 covers the p-side contact electrode 26.

An n-side pad electrode 37 is provided on the n-side contact electrode 27. The planar size of the n-side pad electrode 37 is larger than the planar size of the n-side contact electrode 27. The n-side pad electrode 37 covers the n-side contact electrode 27.

The p-side contact electrode 26 includes a material, such as Ag and Ag alloy, having high reflectance to the emission light of the light emitting layer 13. The p-side pad electrode 36 includes a material, such as Al, Ti, Ni, and Au, for protecting the p-side contact electrode 26 from corrosion.

The n-side contact electrode 27 includes e.g. at least one of nickel (Ni), gold (Au), and rhodium (Rh), capable of forming an alloy with gallium (Ga) included in the semiconductor layer 15. The n-side pad electrode 37 includes a material, such as Al, Ti, Ni, and Au, for protecting the n-side contact electrode 27 from corrosion.

An insulating film 51 is provided on the second surface of the semiconductor layer 15. The insulating film 51 is e.g. a silicon oxide film.

The insulating film 51 insulates the n-side electrode including the n-side contact electrode 27 and the n-side pad electrode 37 from the p-side electrode including the p-side contact electrode 26 and the p-side pad electrode 36.

The insulating film 51 is provided on the end surface of the light emitting layer 13 and the end surface of the second semiconductor layer 12. The insulating film 51 covers and protects the end surface of the light emitting layer 13 and the end surface of the second semiconductor layer 12.

An insulating film 52 is selectively provided on the insulating film 51 and the p-side pad electrode 36. The insulating film 52 is e.g. a silicon oxide film.

The insulating film 52 is provided also on the side surface 15c of the first semiconductor layer 11 continued from the first surface 15a. The insulating film 52 covers and protects the side surface 15c.

On the insulating film 52, a p-side interconnection layer 21 is provided. The p-side interconnection layer 21 is provided on the insulating film 52 on the p-side pad electrode 36. The p-side interconnection layer 21 is connected to the p-side pad electrode 36 through a plurality of p-side vias 21a penetrating through the insulating film 52.

An n-side interconnection layer 22 is provided on the n-side pad electrode 37. The n-side interconnection layer 22 is connected to the n-side pad electrode 37. Part of the n-side interconnection layer 22 extends on the insulating film 52 to the position opposed to the p-side pad electrode 36. The part of the n-side interconnection layer 22 is opposed to the p-side pad electrode 36 across a varistor film 41 described below.

Between the p-side pad electrode 36 and the n-side interconnection layer 22, a varistor film 41 is provided. The varistor film 41 is in contact with the p-side pad electrode 36 and the n-side interconnection layer 22.

The varistor film 41 has a nonlinear resistance characteristic. The varistor film 41 is a film including e.g. BaTiO$_3$, SrTiO$_3$, ZnO, BiO, CoO, MnO, SbO, CrO, NiO, SiN, or SiO.

On the p-side interconnection layer 21, a p-side metal pillar 23 is provided. The p-side interconnection layer 21 and the p-side metal pillar 23 constitute a p-side interconnection section in this embodiment. On the n-side interconnection layer 22, an n-side metal pillar 24 is provided. The n-side interconnection layer 22 and the n-side metal pillar 24 constitute an n-side interconnection section in this embodiment.

A resin layer 35 is filled between the p-side interconnection layer 21 and the n-side interconnection layer 22, and between the p-side metal pillar 23 and the n-side metal pillar 24. The resin layer 35 covers the periphery of the p-side interconnection layer 21, the periphery of the n-side interconnection layer 22, the periphery of the p-side metal pillar 23, and the periphery of the n-side metal pillar 24.

Also on the side surface 15c of the semiconductor layer 15, the resin layer 35 is provided via the insulating film 52. The periphery of the side surface 15c is covered with the resin layer 35 via the insulating film 52.

The surface of the p-side metal pillar 23 on the opposite side from the p-side interconnection layer 21 is exposed from the resin layer 35 and functions as a p-side external terminal 23a. The surface of the n-side metal pillar 24 on the opposite side from the n-side interconnection layer 22 is exposed from the resin layer 35 and functions as an n-side external terminal 24a.

The p-side external terminal 23a and the n-side external terminal 24a are bonded with e.g. solder to pads formed on a mounting substrate, not shown.

The distance between the p-side external terminal 23a and the n-side external terminal 24a exposed at the same surface (the lower surface in FIG. 15) of the resin layer 35 is larger than the distance between the p-side interconnection layer 21 and the n-side interconnection layer 22. The p-side external terminal 23a and the n-side external terminal 24a are separated by a distance such that no short circuit occurs therebetween by solder and the like at the time of mounting onto the mounting substrate.

The p-side interconnection layer 21 can be made close to the n-side interconnection layer 22 up to the process limit. This can expand the area of the p-side interconnection layer 21. As a result, the contact area between the p-side interconnection layer 21 and the p-side electrode 16 can be increased. This can improve the current distribution and heat dissipation.

The area of the p-side interconnection layer 21 being in contact with the p-side pad electrode 36 through the plurality of vias 21a is larger than the area of the n-side interconnection layer 22 being in contact with the n-side pad electrode 37. This improves the current distribution to the light emitting layer 13, and can improve the heat dissipation of the light emitting layer 13.

The area of the n-side interconnection layer 22 extending on the second surface is larger than the area of the n-side interconnection layer 22 being in contact with the n-side pad electrode 37.

According to the third embodiment, the light emitting layer 13 is formed over a larger region than the n-side contact electrode 27. Thus, high optical output can be obtained. Furthermore, the n-side contact electrode 27 provided in a region smaller than the region including the light emitting layer 13 is extracted to the mounting surface side as an n-side interconnection layer 22 having a larger area.

The p-side metal pillar 23 is thicker than the p-side interconnection layer 21. The n-side metal pillar 24 is thicker than the n-side interconnection layer 22. Each thickness of the p-side metal pillar 23, the n-side metal pillar 24, and the resin layer 35 is thicker than the semiconductor layer 15. Here, the "thickness" represents the thickness in the vertical direction in FIG. 15.

Each thickness of the p-side metal pillar 23 and the n-side metal pillar 24 is thicker than the thickness of the chip including the semiconductor layer 15, the p-side electrode, and the n-side electrode.

Also in the third embodiment, even if the substrate used to form the semiconductor layer 15 is removed, a support body including the p-side metal pillar 23, the n-side metal pillar 24, and the resin layer 35 stably supports the semiconductor layer 15. This can increase the mechanical strength of the semiconductor light emitting device 3.

The resin layer 35 reinforces the p-side metal pillar 23 and the n-side metal pillar 24. Preferably, the thermal expansion coefficient of the resin layer 35 is equal or close to that of the mounting substrate. Such a resin layer 35 can be made of e.g. epoxy resin, silicone resin, or fluororesin.

The resin layer 35 is filled via the insulating film 52 in a trench for separating the semiconductor layer 15 into a plurality on the substrate in the wafer state. Thus, the side surface 15c of the semiconductor layer 15 is covered and protected with the insulating film 52 being an inorganic film and the resin layer 35.

The semiconductor light emitting device 3 is mounted on a mounting substrate through the p-side external terminal 23a and the n-side external terminal 24a. In this state, the p-side metal pillar 23 and the n-side metal pillar 24 can absorb and relax the stress applied to the semiconductor layer 15 through solder.

The p-side interconnection section including the p-side interconnection layer 21 and the p-side metal pillar 23 is connected to the p-side pad electrode 36 through a plurality of vias 21a separated from each other. Thus, high stress relaxation effect is achieved by the p-side interconnection section.

Alternatively, the p-side interconnection layer 21 may be connected to the p-side pad electrode 36 through a via provided in one large first opening and having a larger planar size than the via 21a. In this case, heat dissipation of the light emitting layer 13 can be improved.

The substrate used to form the semiconductor layer 15 is removed from above the first surface 15a. Thus, the semiconductor light emitting device 3 can be reduced in profile.

On the first surface 15a of the semiconductor layer 15, a phosphor layer 30 is provided. The phosphor layer 30 includes a transparent resin 31 as a transparent medium, and a plurality of particles of phosphor 32 dispersed in the transparent resin 31.

The transparent resin 31 is transparent to the excitation light of the light emitting layer 13 and the fluorescence of the phosphor 32. The transparent resin 31 can be made of e.g. silicone resin, acrylic resin, or phenyl resin.

The phosphor 32 can absorb the excitation light of the light emitting layer 13 and emit wavelength converted light. Thus, the semiconductor light emitting device 3 can emit mixed light of the excitation light of the light emitting layer 13 and the wavelength converted light of the phosphor 32.

For instance, the phosphor 32 can be a yellow phosphor emitting yellow light. Then, for instance, white color or light bulb color can be obtained as a mixed color of blue light of the light emitting layer 13 made of GaN-based material and yellow light being the wavelength converted light of the phosphor 32. The phosphor layer 30 may be configured to include a plurality of kinds of phosphors (e.g., a red phosphor emitting red light and a green phosphor emitting green light).

The first semiconductor layer 11 is electrically connected to the n-side external terminal 24a through the n-side contact electrode 27, the n-side pad electrode 37, the n-side interconnection layer 22, and the n-side metal pillar 24. The second semiconductor layer 12 is electrically connected to the p-side external terminal 23a through the p-side contact electrode 26, the p-side pad electrode 36, the p-side interconnection layer 21, and the p-side metal pillar 23.

According to the third embodiment, a varistor element is incorporated in the semiconductor light emitting device 3. In the varistor element, the p-side electrode including the p-side contact electrode 26 and the p-side pad electrode 36 serves as one electrode, and the n-side interconnection layer 22 serves as the other electrode.

That is, the semiconductor layer 15 and the varistor film 41 are parallel connected between the p-side external terminal 23a and the n-side external terminal 24a. The varistor film 41 functions as a protective element for protecting the semiconductor layer 15 from surge voltage. The surge current can flow between the p-side external terminal 23a and the n-side external terminal 24a through the varistor film 41 without passing through the semiconductor layer 15.

In the normal operation, a voltage less than or equal to the rated voltage is applied between the p-side external terminal 23a and the n-side external terminal 24a. In this case, the varistor film 41 is in the high resistance state. Thus, no short circuit occurs through the varistor film 41 between the p-side electrode and the n-side interconnection layer 22.

When a voltage (surge voltage) larger than the rated voltage surges into the p-side external terminal 23a or the n-side external terminal 24a, a voltage larger than the rated voltage of the semiconductor light emitting device 3 is applied to the varistor film 41. Then, the electrical resistance of the varistor film 41 rapidly decreases. By the application of the above surge voltage, the varistor film 41 is subjected to breakdown earlier than the semiconductor layer 15.

Thus, the surge current can be passed between the p-side external terminal 23a and the n-side external terminal 24a through the p-side metal pillar 23, the p-side interconnection layer 21, the p-side electrode, the varistor film 41, the n-side interconnection layer 22, and the n-side metal pillar 24 without passing through the semiconductor layer 15 (light emitting layer 13). Thus, the semiconductor layer 15 can be protected from ESD.

The insulating film 51, the insulating film 52, and the resin layer 35 have higher breakdown voltage than the varistor film 41, and hence are not subjected to breakdown by the application of the above surge voltage. On the end surface of the light emitting layer 13, the insulating film 51 is provided for protection. The insulating film 51 is a silicon oxide film superior to resin in breakdown voltage.

According to the third embodiment, part of the insulating film 52 provided for insulation between the p-side electrode and the n-side interconnection layer 22 is replaced by the varistor film 41. Thus, a semiconductor light emitting device 3 superior in ESD resistance can be provided without hindrance to downsizing of the semiconductor light emitting device 3 having a chip size package structure.

Fourth Embodiment

Figure 16:
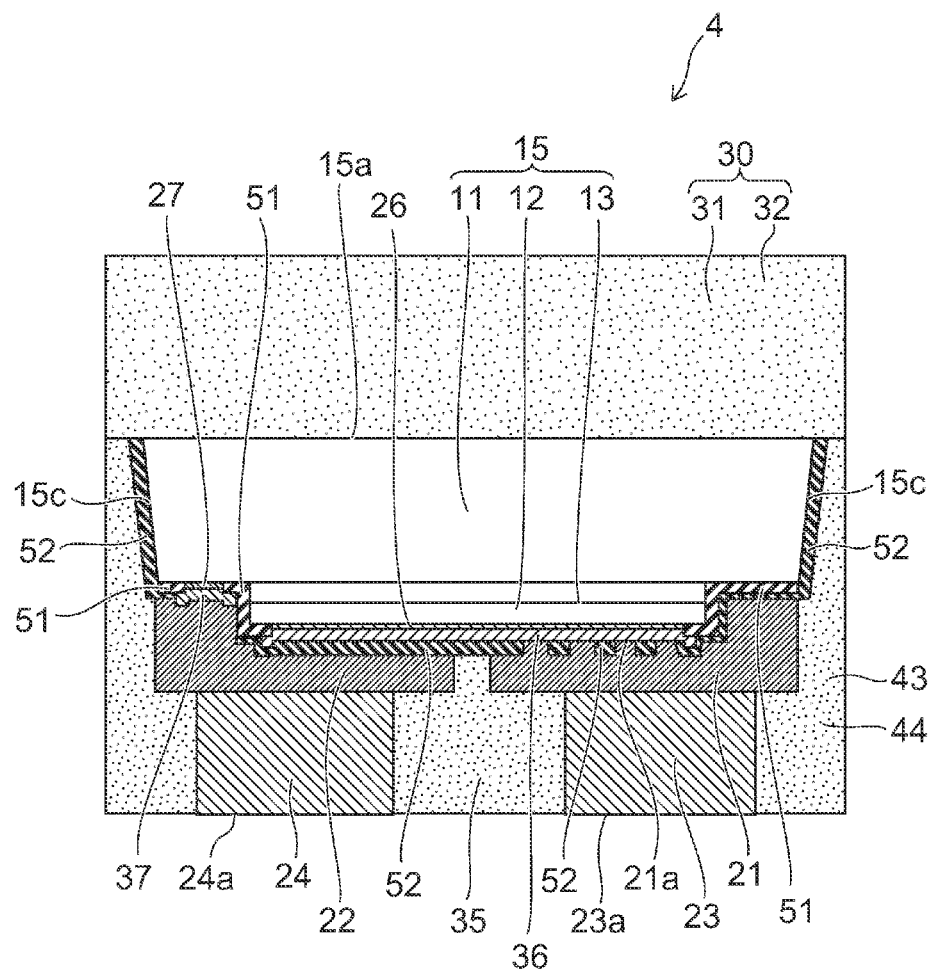
FIG. 16 is a schematic cross-sectional view of a semiconductor light emitting device of a fourth embodiment.

FIG. 16 is a schematic sectional view of a semiconductor light emitting device 4 of a fourth embodiment.

The semiconductor light emitting device 4 of the fourth embodiment is different from the semiconductor light emitting device 3 of the third embodiment in that the varistor film 41 is not provided, but as in the semiconductor light emitting device 2 of the second embodiment, the resin layer 35 is dispersed with a plurality of varistor particles 43 and a plurality of conductive particles 44.

The varistor particle 43 is a particle made of e.g. $BaTiO_3$, $SrTiO_3$, ZnO, BiO, CoO, MnO, SbO, CrO, NiO, SiN, or SiO.

The conductive particle 44 has a lower electrical resistance than the varistor particle 43. This facilitates electrical connection between the varistor particles 43 through the conductive particles 44 at the time of application of surge voltage. The conductive particle 44 is e.g. a gold particle.

According to the fourth embodiment, the resin layer 35 dispersed with varistor particles 43 can function as a varistor element having a nonlinear resistance characteristic. The p-side interconnection section including the p-side interconnection layer 21 and the p-side metal pillar 23 functions as one electrode of the varistor element. The n-side interconnection section including the n-side interconnection layer 22 and the n-side metal pillar 24 functions as the other electrode of the varistor element.

The insulating film 51, 52 not including varistor particles is provided between the p-side pad electrode 36 and the resin layer 35, and between the n-side pad electrode 37 and the resin layer 35. Thus, at the time of application of surge voltage, no short circuit occurs through the resin layer 35 between the p-side electrode and the n-side electrode.

In the semiconductor light emitting device 4 of the fourth embodiment, the semiconductor layer 15 and the varistor element are parallel connected between the p-side external terminal 23a and the n-side external terminal 24a. The surge current can flow between the p-side external terminal 23a and the n-side external terminal 24a through the resin layer 35 functioning as a varistor element without passing through the semiconductor layer 15.

In the normal operation, a voltage less than or equal to the rated voltage is applied between the p-side external terminal 23a and the n-side external terminal 24a. In this case, the varistor particles 43 and the resin layer 35 including the varistor particles 43 are in the high resistance state. Thus, no short circuit occurs through the resin layer 35 between the p-side interconnection section and the n-side interconnection section.

When a voltage (surge voltage) larger than the rated voltage surges into the p-side external terminal 23a or the n-side external terminal 24a, a voltage larger than the rated voltage of the semiconductor light emitting device 4 is applied to the varistor particles 43. Then, the electrical resistance of the varistor particles 43 and the resin layer 35 including the varistor particles 43 rapidly decrease. By the application of the above surge voltage, the varistor particles 43 and the resin layer 35 including the varistor particles 43 are subjected to breakdown earlier than the semiconductor layer 15.

Thus, the surge current can be passed between the p-side external terminal 23a and the n-side external terminal 24a through the resin layer 35 between the p-side interconnection section and the n-side interconnection section without passing through the semiconductor layer 15 (light emitting layer 13). Thus, the semiconductor layer 15 can be protected from ESD.

According to the fourth embodiment, the resin layer 35 provided for insulation between and reinforcement of the p-side interconnection section and the n-side interconnection section can be used as a varistor element. Thus, a semiconductor light emitting device 4 superior in ESD resistance can be provided without hindrance to downsizing of the semiconductor light emitting device 4 having a chip size package structure.

Furthermore, the resin layer 35 is dispersed with conductive particles 44 in addition to varistor particles 43. This facilitates electrical connection between the varistor particles 43 at the time of application of surge voltage, and facilitates adjusting the voltage of short circuit between the p-side interconnection section and the n-side interconnection section through the resin layer 35.

The insulating film 51 and the insulating film 52 have higher breakdown voltage than the resin layer 35 functioning as a varistor element, and hence are not subjected to breakdown by the application of the above surge voltage.

In the above embodiments, the p-side interconnection layer 21 and the n-side interconnection layer 22 may be bonded to pads of the mounting substrate without providing the p-side metal pillar 23 and the n-side metal pillar 24.

The p-side interconnection layer 21 and the p-side metal pillar 23 are not limited to being separate bodies. The p-side interconnection layer 21 and the p-side metal pillar 23 may be integrally provided in the same process to constitute a p-side interconnection section. Similarly, the n-side interconnection layer 22 and the n-side metal pillar 24 are not limited to being separate bodies. The n-side interconnection layer 22 and the n-side metal pillar 24 may be integrally provided in the same process to constitute an n-side interconnection section.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device comprising:
   a semiconductor layer including a light emitting layer, a first surface, a second surface opposite to the first surface, and side surfaces connected between the first surface and the second surface;
   a phosphor layer provided in contact with the first surface;
   a first electrode provided in an emitting region on the second surface;
   a second electrode provided in a non-emitting region on the second surface;
   a first interconnection section provided on the first electrode and electrically connected to the first electrode;
   a second interconnection section provided on the second electrode and electrically connected to the second electrode;
   a first insulating film provided to cover substantially all of the side surfaces of the semiconductor layer between the first surface and the second surface;
   a second insulating film and a third insulating film with a plurality of vias provided on the second surface, wherein end portions of the first electrode are directly between the second insulating film and the third insulating film; and
   a resin layer provided between the first interconnection section and the second interconnection section, and provided on the first insulating film in contact with the phosphor layer such that the first insulating film is between the side surfaces of the semiconductor layer and the resin layer, the resin layer including varistor particles and conductive particles in its entirety.

2. The semiconductor light emitting device according to claim 1, wherein the conductive particles are gold particles.

3. The semiconductor light emitting device according to claim 1, wherein the second insulating film covers an end surface of the light emitting layer and has a higher breakdown voltage than the resin layer.

4. The semiconductor light emitting device according to claim 1, wherein the third insulating film is provided on the first electrode, and wherein part of the second interconnection section extends on the third insulating film.

5. The semiconductor light emitting device according to claim 4, wherein the first interconnection section includes:
 a first interconnection layer provided on the first electrode; and
 a first metal pillar provided on the first interconnection layer and being thicker than the first interconnection layer, and
wherein the second interconnection section includes:
 a second interconnection layer provided on the second electrode and on the third insulating film; and
 a second metal pillar provided on the second interconnection layer and being thicker than the second interconnection layer.

6. The semiconductor light emitting device according to claim 1, wherein the varistor particles are particles of $BaTiO_3$, $SrTiO_3$, ZnO, BiO, CoO, MnO, SbO, CrO, NiO, SiN, or SiO.

7. The semiconductor light emitting device according to claim 1, wherein the semiconductor layer is formed on a substrate, which is then removed.

8. The semiconductor light emitting device according to claim 7, wherein an unevenness is formed on the first surface of the semiconductor layer from which the substrate has been removed.

9. The semiconductor light emitting device according to claim 7, wherein the phosphor layer is provided on the first surface of the semiconductor layer from which the substrate has been removed.

10. The semiconductor light emitting device according to claim 1, wherein the conductive particles have a lower electrical resistance than the varistor particles.

11. The semiconductor light emitting device according to claim 1, wherein when a voltage larger than a rated voltage of the semiconductor light emitting device is applied to the varistor particles, a current flows through the first interconnection section, the resin layer, and the second interconnection section without passing through the light emitting layer.

* * * * *